(12) United States Patent
Ko et al.

(10) Patent No.: US 11,456,439 B2
(45) Date of Patent: Sep. 27, 2022

(54) LIGHT EMITTING ELEMENT AND DISPLAY DEVICE INCLUDING A SEMICONDUCTOR CORE SURROUNDED BY PROTECTING AND INSULATING LAYERS

(71) Applicant: Samsung Display Co., Ltd., Yongin-si (KR)

(72) Inventors: Yun Hyuk Ko, Yongin-si (KR); Chang Hee Lee, Yongin-si (KR); Jin Oh Kwag, Yongin-si (KR); Keun Kyu Song, Yongin-si (KR); Yun Ku Jung, Yongin-si (KR); Sung-Chan Jo, Yongin-si (KR); Jae Kook Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 82 days.

(21) Appl. No.: 17/031,778

(22) Filed: Sep. 24, 2020

(65) Prior Publication Data
US 2021/0226165 A1    Jul. 22, 2021

(30) Foreign Application Priority Data
Jan. 22, 2020    (KR) .................. 10-2020-0008652

(51) Int. Cl.
*H01L 51/52*    (2006.01)
*H01L 27/32*    (2006.01)
(Continued)

(52) U.S. Cl.
CPC ........ *H01L 51/5253* (2013.01); *H01L 27/326* (2013.01); *H01L 33/305* (2013.01);
(Continued)

(58) Field of Classification Search
CPC ........... H01L 51/5253; H01L 2251/301; H01L 27/326; H01L 33/30; H01L 33/305; H01L 33/32; H01L 33/325
See application file for complete search history.

(56) References Cited

U.S. PATENT DOCUMENTS 6,080,598 A  *  6/2000  Kawai ................... H01S 5/0201
                                                        438/33
6,323,053 B1 *  11/2001  Nishikawa .......... H01L 21/0237
                                                        257/E21.127
(Continued)

FOREIGN PATENT DOCUMENTS

JP          5085283 B2    11/2012
KR      10-0693129 B1     3/2007
(Continued)

OTHER PUBLICATIONS

Barrera, A. et al; "Photocatalytic activity of Ag/$Al_2O_3$—$Gd_2O_3$ photocatalysts prepared by the sol-gel method in the degradation of 4-chlorophenol"; RSC Adv.; 8; pp. 3108-3119; 2018.
(Continued)

*Primary Examiner* — Ida M Soward
(74) *Attorney, Agent, or Firm* — Lewis Roca Rothgerber Christie LLP

(57) ABSTRACT

A light emitting element and a display device including the same are provided. The light emitting element includes a first semiconductor layer, a second semiconductor layer, and an active layer between the first semiconductor layer and the second semiconductor layer, a protective layer surrounding an outer surface of at least one of the first semiconductor layer, the second semiconductor layer, and the active layer, and an insulating layer surrounding an outer surface of the protective layer. A surface of at least one of the first semiconductor layer, the second semiconductor layer, and the active layer includes a first lattice point, wherein the (Continued)

protective layer includes a first atom and a second atom, and wherein the first atom of the protective layer is at the first lattice point.

22 Claims, 17 Drawing Sheets

(51) Int. Cl.
H01L 33/30 (2010.01)
H01L 33/32 (2010.01)

(52) U.S. Cl.
CPC ............ *H01L 33/32* (2013.01); *H01L 33/325* (2013.01); *H01L 2251/301* (2013.01)

(56) References Cited

U.S. PATENT DOCUMENTS

| | | | |
|---|---|---|---|
| 7,588,955 B2 | 9/2009 | Huang et al. | |
| 8,330,173 B2 | 12/2012 | Kim | |
| 8,558,274 B2 | 10/2013 | Kim et al. | |
| 10,326,054 B1* | 6/2019 | Liao | H01L 21/0254 |
| 10,483,365 B2* | 11/2019 | Suzuki | H01L 29/0673 |
| 10,644,021 B2* | 5/2020 | Lee | H01L 29/66825 |
| 2014/0264372 A1* | 9/2014 | Fujikane | H01L 29/2003 438/478 |
| 2016/0027961 A1 | 1/2016 | Mi et al. | |
| 2020/0286947 A1* | 9/2020 | Kang | H01L 27/15 |
| 2020/0403129 A1* | 12/2020 | Lee | H01L 33/382 |
| 2021/0313494 A1* | 10/2021 | Im | H01L 33/20 |
| 2022/0068901 A1* | 3/2022 | Kong | H01L 25/0753 |
| 2022/0139319 A1* | 5/2022 | Oh | H01L 25/0753 345/204 |

FOREIGN PATENT DOCUMENTS

| | | |
|---|---|---|
| KR | 10-1186683 B1 | 9/2012 |
| KR | 10-1515100 B1 | 4/2015 |

OTHER PUBLICATIONS

Kang, Jung-Hyun et al; "Defect-Free GaAs/AlGaAs Core-Shell Nanowires on Si Substrates"; Crystal Growth & Design; 11; pp. 3109-3114; 2011.

Yu, Zhi-Guo et al; "Surface plasmon-enhanced nanoporous GaN-based green light-emitting diodes with $Al_2O_3$ passivation layer"; Optics Express; vol. 22; Issue S6; pp. A1596-A1603; 2014.

* cited by examiner

LIGHT EMITTING ELEMENT AND DISPLAY DEVICE INCLUDING A SEMICONDUCTOR CORE SURROUNDED BY PROTECTING AND INSULATING LAYERS

CROSS-REFERENCE TO RELATED APPLICATION

This application claims priority to and the benefit of Korean Patent Application No. 10-2020-0008652, filed on Jan. 22, 2020, the content of which in its entirety is herein incorporated by reference.

BACKGROUND

1. Field

The disclosure relates to a light emitting element and a display device including the same.

2. Description of the Related Art

Importance of display devices is increasing with the development of multimedia. In response thereto, various types of display devices, such as an organic light emitting display (OLED) and a liquid crystal display (LCD), have been developed and are currently in use.

A device for displaying an image of a display device includes a display panel, such as, an organic light emitting display panel or a liquid crystal display panel. A light emitting display panel may include a light emitting element. For example, a light emitting diode (LED) includes an organic light emitting diode using an organic material as a fluorescent material and an inorganic light emitting diode using an inorganic material as a fluorescent material.

An inorganic light emitting diode using an inorganic semiconductor as a fluorescent material has durability in a high temperature environment and has a high efficiency of blue light compared to an organic light emitting diode. In addition, in a manufacturing process, which has been pointed out as a limitation of the conventional inorganic light emitting diode element, a transfer method using dielectrophoresis (DEP) has been developed. Therefore, research on the inorganic light emitting diode having high durability and efficiency compared to the organic light emitting diode has been continued.

SUMMARY

Example embodiments of the present disclosure provide a light emitting element capable of reducing or minimizing a surface defect of a semiconductor core and improving element life and efficiency, and a display device including the same.

The example embodiments of the present disclosure are not limited to the above-described aspects, and other technical aspects which are not described will be clearly understood by those skilled in the art from the following description.

A light emitting element according to one or more embodiments of the present disclosure includes a first semiconductor layer, a second semiconductor layer, and an active layer between the first semiconductor layer and the second semiconductor layer, a protective layer surrounding an outer surface of at least one of the first semiconductor layer, the second semiconductor layer, and the active layer, and an insulating layer surrounding an outer surface of the protective layer. A surface of at least one of the first semiconductor layer, the second semiconductor layer, and the active layer includes a first lattice point, wherein the protective layer includes a first atom and a second atom, and wherein the first atom of the protective layer is at the first lattice point.

In one or more embodiments, the first atom may include a Group 3 element, and the second atom may include a Group 5 element.

In one or more embodiments, the first semiconductor layer, the second semiconductor layer, and/or the active layer may include a third atom and a fourth atom, and the third atom may include a Group 3 element, and the fourth atom may include a Group 5 element.

In one or more embodiments, the third atom may include the same element as the first atom.

In one or more embodiments, the fourth atom may include the same element as the second atom.

In one or more embodiments, the first atom may be bonded to the fourth atom at the first lattice point.

In one or more embodiments, a thickness of the protective layer may be smaller than a thickness of the insulating layer.

In one or more embodiments, the protective layer may be a monolayer including the first atom and the second atom.

In one or more embodiments, the insulating layer may include an inorganic material.

In one or more embodiments, the insulating layer may be directly on the protective layer.

A display device according to one or more embodiments of the present disclosure includes a plurality of pixels on a substrate. In one or more embodiments, each of the pixels includes a first electrode and a second electrode spaced from each other on the substrate, and a plurality of light emitting elements having one end portion connected to the first electrode and another end portion connected to the second electrode. In one or more embodiments, each of the light emitting elements includes a semiconductor core, a protective layer surrounding an outer surface of the semiconductor core and comprising a first atom and a second atom, and an insulating layer surrounding an outer surface of the protective layer. In one or more embodiments, a surface of the semiconductor core includes a first lattice point. In one or more embodiments, the first atom of the protective layer is at the first lattice point.

In one or more embodiments, the first atom may include a Group 3 element, and the second atom may include a Group 5 element.

In one or more embodiments, the semiconductor core may include a first semiconductor layer, a second semiconductor layer, and an active layer between the first semiconductor layer and the second semiconductor layer.

In one or more embodiments, the semiconductor core may include a third atom and a fourth atom, the third atom may be formed of a Group 3 element, and the fourth atom may be formed of a Group 5 element.

In one or more embodiments, the first atom may be bonded to the fourth atom at the first lattice point.

In one or more embodiments, the third atom may include the same element as the first atom.

In one or more embodiments, the fourth atom may include the same element as the second atom.

In one or more embodiments, a thickness of the protective layer may be smaller than a thickness of the insulating layer.

In one or more embodiments, the insulating layer may include an inorganic material.

In one or more embodiments, one surface of the protective layer may be in contact with the semiconductor core, and another surface of the protective layer may be in contact with the insulating layer.

In one or more embodiments, the first atom may include a Group 5 element, and the second atom may include a Group 3 element.

In one or more embodiments, a surface of at least one of the first semiconductor layer, the second semiconductor layer, and the active layer may further include a second lattice point, and the second atom of the protective layer may be at the second lattice point.

Details of other example embodiments are included in the detailed description and drawings.

According to the example embodiments, even though a defect part such as a vacancy exists on a semiconductor core surface, concentration of the vacancy may be reduced or the defect part may be protected by the protective layer by forming the protective layer on the semiconductor core of the light emitting element. For example, because a surface defect of the semiconductor core may be minimized or reduced, life, efficiency, and crystallizability of the light emitting element may be improved.

Effects according to the example embodiments are not limited by the contents illustrated above, more various effects are included in the present disclosure.

BRIEF DESCRIPTION OF THE DRAWINGS

The above and other features of the disclosure will become more apparent by describing in further detail embodiments thereof with reference to the accompanying drawings, in which.

DETAILED DESCRIPTION

Figure 1:
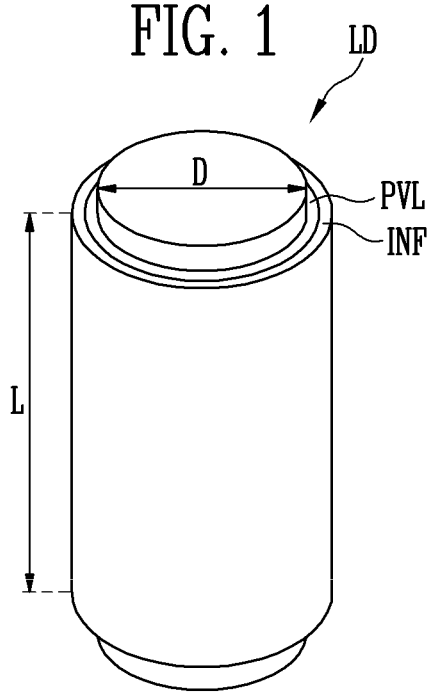
FIGS. 1 and 2 respectively are a perspective view and a cross-sectional view illustrating a light emitting element according to one or more embodiments of the present disclosure.

The features and aspects and a method of achieving them will become apparent with reference to example embodiments described in detail below together with the accompanying drawings. However, the disclosure is not limited to the example embodiments disclosed below, and may be implemented in various different forms. The present embodiments are provided so that the disclosure will be thorough and complete and those skilled in the art to which the disclosure pertains can fully understand the scope of the disclosure. The disclosure is only defined by the scope of the claims.

A case in which an element or a layer is referred to as "on" another element or layer includes a case in which another layer or another element is disposed directly on the other element or between the other layers. The same reference numerals denote to the same components throughout the specification.

Although a first, a second, and the like are used to describe various components, these components are not limited by these terms. These terms are used only to distinguish one component from another component. Therefore, a first component mentioned below may be a second component within the technical spirit. Singular expressions include plural expressions unless the context clearly indicates otherwise.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the terms "substantially," "about," and similar terms are used as terms of approximation and not as terms of degree, and are intended to account for the inherent deviations in measured or calculated values that would be recognized by those of ordinary skill in the art.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present disclosure refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Hereinafter, example embodiments will be described in detail with reference to the accompanying drawings. The same or similar reference numerals are used for the same components in the drawings.

Figure 2:
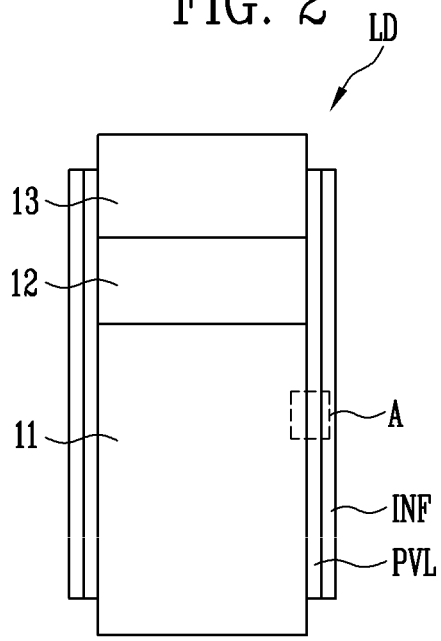

FIGS. 1 and 2 respectively are a perspective view and a cross-sectional view illustrating a light emitting element according to one or more embodiments of the present disclosure. Although a rod-shaped light emitting element LD of a circular columnar shape is shown in FIGS. 1 and 2, a type and/or a shape of the light emitting element LD according to the disclosure are/is not limited thereto.

Referring to FIGS. 1 and 2, the light emitting element LD may include a semiconductor core NR, a protective layer PVL surrounding the semiconductor core NR, and an insulating layer INF surrounding the protective layer PVL. The semiconductor core NR may include a first semiconductor layer 11, a second semiconductor layer 13, and an active layer 12 interposed between the first and second semiconductor layers 11 and 13. For example, the semiconductor core NR may be configured as a stack in which the first semiconductor layer 11, the active layer 12, and the second semiconductor layer 13 are sequentially stacked along one direction.

According to one or more embodiments, the light emitting element LD may be provided in a rod shape extending along one direction. The light emitting element LD may have one side end portion and the other side end portion along the one direction.

According to one or more embodiments, one of the first and second semiconductor layers 11 and 13 may be disposed at one side end portion of the light emitting element LD, and the other one of the first and second semiconductor layers 11 and 13 may be disposed at the other side end portion of the light emitting element LD.

According to one or more embodiments, the light emitting element LD may be a rod-shaped light emitting diode. Here, the rod shape encompasses a rod-like shape or a bar-like shape that is longer in a longitudinal direction than in a width direction (for example, having an aspect ratio greater than 1), such as a circular column or a polygonal column, and a shape of a cross section thereof is not particularly limited. For example, a length L of the light emitting element LD may be greater than a diameter D (or a width of the cross section) thereof.

According to one or more embodiments, the light emitting element LD may have the diameter D and/or the length L as small as a nano scale to a micro scale, for example, a range of a nano scale or a micro scale. However, a size of the light emitting element LD is not limited thereto. For example, the size of the light emitting element LD may be variously changed according to a design condition of various devices using a light emitting device using the light emitting element LD as a light source, for example, a display device.

In one or more embodiments, the first semiconductor layer 11 may include a semiconductor layer doped with a first conductive dopant such as Si, Ge, or Sn. For example, the first semiconductor layer 11 may include at least one semiconductor material from among GaP, GaAs, GaInP, and AlGaInP doped with Si. For example, the first semiconductor layer 11 may include at least one n-type semiconductor layer. However, a material configuring the first semiconductor layer 11 is not limited thereto, and various materials in addition to the above-described materials may configure the first semiconductor layer 11. Detailed description thereof will be described later with reference to FIG. 7.

In one or more embodiments, the active layer 12 may be disposed on the first semiconductor layer 11 and may be formed in a single or multiple quantum well structure. In one or more embodiments, a clad layer doped with a conductive dopant may be formed on and/or under the active layer 12. For example, the clad layer may be formed of an AlGaN layer or an InAlGaN layer. According to one or more embodiments, a material such as AlGaN or AlInGaN may be used to form the active layer 12, and various materials in addition to the above-described materials may configure the active layer 12.

When a voltage equal to or greater than a threshold voltage is applied to both ends of the light emitting element LD, the light emitting element LD may emit light when an electron-hole pair is coupled in the active layer 12. By controlling emission of the light emitting element LD by using such a principle, the light emitting element LD may be used as a light source of various light emitting devices including a pixel of the display device.

In one or more embodiments, the second semiconductor layer 13 may include a semiconductor of a type different from that of the first semiconductor layer 11. For example, the second semiconductor layer 13 may include a semiconductor layer doped with a second conductive dopant such as Mg. For example, the second semiconductor layer 13 may include at least one semiconductor material from among GaP, GaAs, GaInP, and AlGaInP doped with Mg. For example, the second semiconductor layer 13 may include a p-type semiconductor layer. However, a material configuring the second semiconductor layer 13 is not limited thereto, and various materials in addition to the above-described materials may configure the second semiconductor layer 13.

According to one or more embodiments, the light emitting element LD may further include a protective layer PVL provided on a surface of the semiconductor core NR. The protective layer PVL may be disposed to surround an outer peripheral surface (e.g., an outer circumferential surface) of the semiconductor core NR, for example, at least one of the first semiconductor layer 11, the active layer 12, and the second semiconductor layer 13. The protective layer PVL may be directly formed on surfaces of the first semiconductor layer 11, the active layer 12, and the second semiconductor layer 13. However, the protective layer PVL may expose both end portions of the semiconductor core NR having different polarities. For example, the protective layer PVL may expose the both end portions of the semiconductor core NR without covering one or more ends, for example, two planes (for example, an upper surface and a lower surface) of a cylinder including each of the first and second semiconductor layers 11 and 13, which are positioned at both ends of the semiconductor core NR in a longitudinal direction.

In a case where the protective layer PVL is formed on the surface of the semiconductor core NR, even though a defect part such as a vacancy exists on the surface of the semiconductor core NR, concentration of the vacancy may be reduced or the defect part may be protected by the protective layer PVL. For example, because a surface defect of the semiconductor core NR may be minimized or reduced, life and efficiency of the light emitting element LD may be improved. Detailed description thereof will be described later with reference to FIGS. 7 to 13.

According to one or more embodiments, the light emitting element LD may further include an insulating layer INF provided on a surface of the protective layer PVL. The insulating layer INF may be disposed to surround an outer circumferential surface of the protective layer PVL. The insulating layer INF may be directly formed on the surface of the protective layer PVL. A thickness of the insulating layer INF may be greater (e.g., thicker) than a thickness of the protective layer PVL, but is not necessarily limited thereto.

In one or more embodiments, the insulating layer INF may expose the both end portions of the semiconductor core NR having different polarities. For example, the insulating layer INF may expose the both end portions of the semiconductor core NR without covering the one or more ends, for example, the two planes (for example, an upper surface and a lower surface) of a cylinder including each of the first and second semiconductor layers 11 and 13, which are positioned at both ends of the semiconductor core NR in the longitudinal direction.

Because the insulating layer INF is provided on the semiconductor core NR and the protective layer PVL, the active layer 12 may be prevented (or protected) from being short-circuited with at least one electrode (for example, at least one contact electrode from among the contact electrodes connected to respective ends of the light emitting element LD). Therefore, electrical stability of the light emitting element LD may be secured.

In one or more embodiments, the light emitting element LD may further include additional components in addition to the first semiconductor layer 11, the active layer 12, the second semiconductor layer 13, the protective layer PVL, and/or the insulating layer INF. For example, the light emitting element LD may further include at least one phosphor layer, an active layer, a semiconductor layer, an electrode layer disposed on one end side of the first semiconductor layer 11, the active layer 12, and/or the second semiconductor layer 13, and/or another electrode layer disposed on one end side of the second semiconductor layer 13.

Figure 3:
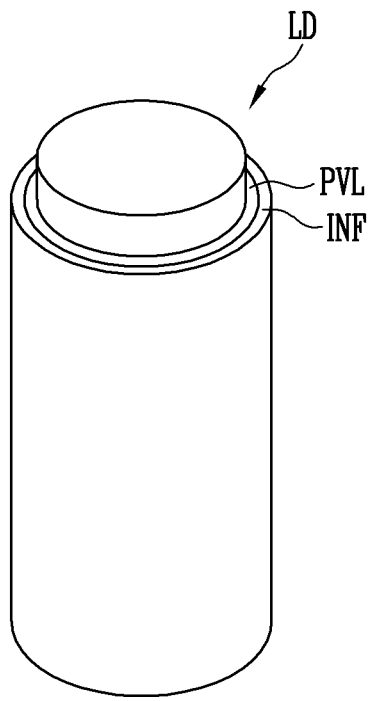
FIGS. 3 and 4 respectively are a perspective view and a cross-sectional view illustrating a light emitting element according to one or more other embodiments of the present disclosure.
Figure 4:
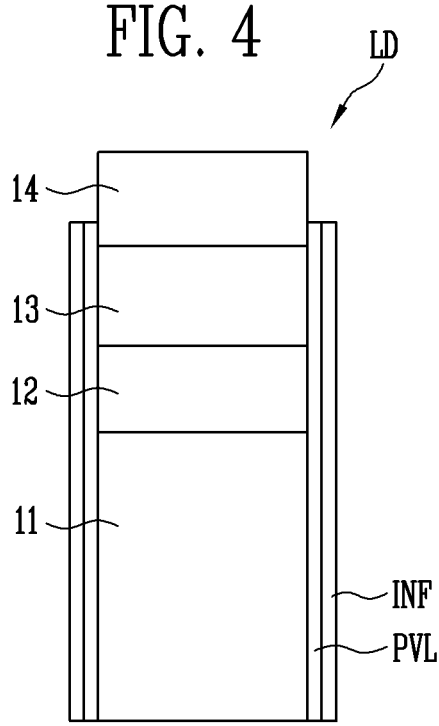
Figure 5:
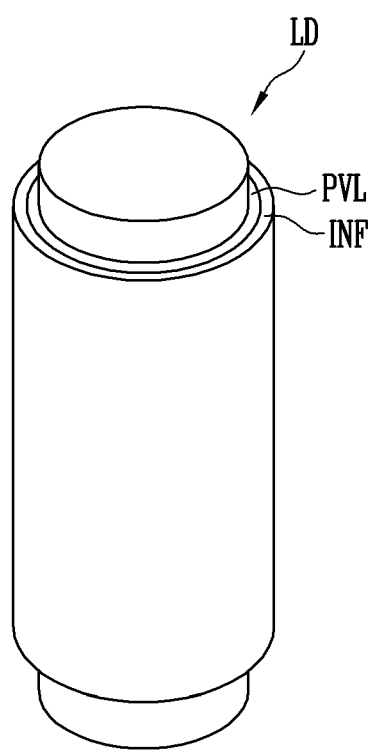
FIGS. 5 and 6 respectively are a perspective view and a cross-sectional view illustrating the light emitting element according to one or more other embodiments of the present disclosure.
Figure 6:
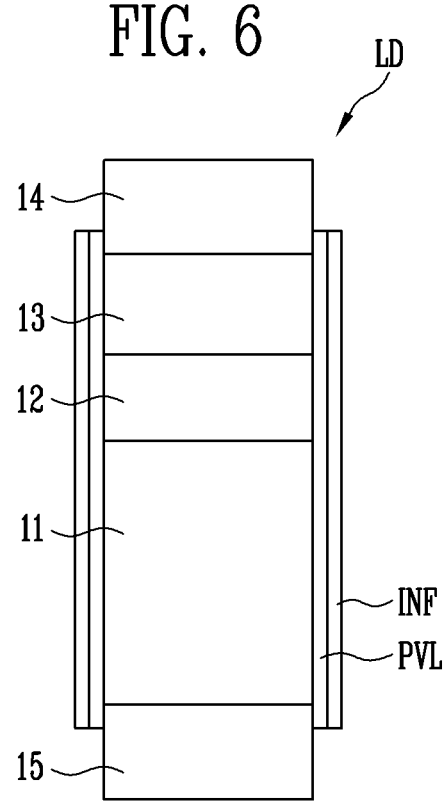

FIGS. 3 and 4 respectively are a perspective view and a cross-sectional view illustrating the light emitting element according to one or more embodiments of the present disclosure. FIGS. 5 and 6 respectively are a perspective view and a cross-sectional view illustrating the light emitting element according to one or more embodiments of the present disclosure.

Referring to FIGS. 3 and 4, the light emitting element LD may further include at least one electrode layer 14 disposed on one end side of the second semiconductor layer 13. In one or more embodiments, the at least one electrode layer 14 may be disposed on one end side of the first semiconductor layer 11.

Referring to FIGS. 5 and 6, the light emitting element LD may further include at least another electrode layer 15 disposed on one end side of the first semiconductor layer 11.

In one or more embodiments, each of the electrode layers 14 and 15 may be an ohmic contact electrode, but is not limited thereto. In one or more embodiments, each of the electrode layers 14 and 15 may include a metal or a conductive metal oxide. For example, each of the electrode layers 14 and 15 may be formed of chromium (Cr), titanium (Ti), aluminum (Al), gold (Au), nickel (Ni), an oxide or an alloy thereof, a transparent electrode material such as indium tin oxide (ITO), indium zinc oxide (IZO), zinc oxide (ZnO), or an indium tin zinc oxide (ITZO) alone, or in combination thereof. The electrode layers 14 and 15 may be substantially transparent or translucent. Therefore, light generated in the light emitting element LD may pass through the electrode layers 14 and 15 and may be emitted to the outside of the light emitting element LD.

According to one or more embodiments, the protective layer PVL and/or the insulating layer INF may or may not at least partially surround outer peripheral surfaces (e.g., outer circumferential surfaces) of the electrode layers 14 and 15. For example, the protective layer PVL and/or the insulating layer INF may be selectively formed on surfaces of the electrode layers 14 and 15. In one or more embodiments, the protective layer PVL and/or the insulating layer INF may be formed to expose the both ends of the light emitting elements LD having different polarities. For example, the protective layer PVL and/or the insulating layer INF may expose at least one region of the electrode layers 14 and 15. However, the disclosure is not necessarily limited thereto.

Figure 7:
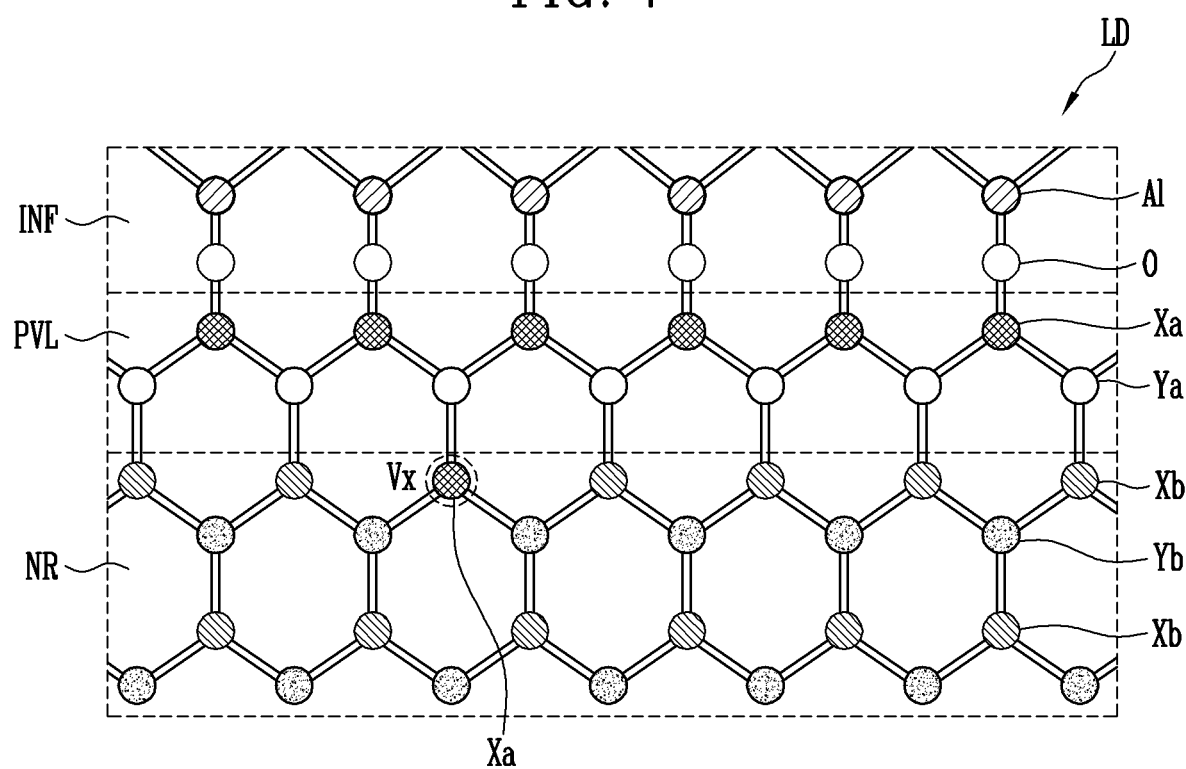
FIG. 7 is an enlarged cross-sectional view of a region A of FIG. 2, according to one or more embodiments of the present disclosure.

FIG. 7 is an enlarged cross-sectional view of a region A of FIG. 2, according to one or more embodiments of the present disclosure.

Referring to FIG. 7, a direct chemical bond may be formed between the semiconductor core NR, the protective layer PVL, and/or the insulating layer INF.

In one or more embodiments, the insulating layer INF may be formed of an inorganic material, and a direct chemical bond may be formed between the insulating layer INF and the protective layer PVL.

In FIG. 7, an example in which the insulating layer INF is formed of $Al_2O_3$ and an oxygen atom configuring the insulating layer INF form a chemical bond with the protective layer PVL is illustrated, but the present disclosure is not necessarily limited thereto. For example, the insulating layer INF may include at least one insulating material from among $SiO_2$, $Si_3N_4$, and $TiO_2$.

In one or more embodiments, the protective layer PVL may be formed of a first atom Xa and a second atom Ya.

In one or more embodiments, the first atom Xa may be a Group 3 element, and the second atom Ya may be a Group 5 element. For example, the first atom Xa may include at least one of B, Al, Ga, and In, and the second atom Ya may include at least one of N, P, As, and Sb. However, the present disclosure is not necessarily limited thereto. In another embodiment, the first atom Xa may be a Group 5 element, and the second atom Ya may be a Group 3 element.

In FIG. 7, an example in which the protective layer PVL is a monolayer composed of the first atom Xa and the second atom Ya is illustrated, but the disclosure is not necessarily limited thereto.

In one or more embodiments, the semiconductor core NR may be formed of a third atom Xb and a fourth atom Yb.

In one or more embodiments, the third atom Xb may be substantially the same as the first atom Xa described above, and the fourth atom Yb may be substantially the same as the second atom Ya described above. For example, the third atom Xb may be a Group 3 element, and the fourth atom Yb may be a Group 5 element. For example, the third atom Xb may include at least one of B, Al, Ga, and In, and the fourth atom Yb may include at least one of N, P, As, and Sb, but the present disclosure is not necessarily limited thereto.

In one or more embodiments, when a dry etch process is performed to manufacture the semiconductor core NR, an atom on the surface of the semiconductor core NR may be partially lacked and a vacancy or a dangling bond may be generated. Even though the dry etch is performed to control such a surface defect, a defect part of the semiconductor core NR may not be eliminated. In one or more embodiments, even though the insulating layer INF is directly formed on the semiconductor core NR, a lattice defect may exist at an interface with the insulating layer INF due to the vacancy of the semiconductor core NR. Therefore, the insulating layer INF may not be grown and thus the surface of the semiconductor core NR may not be sufficiently protected. For example, the life, efficiency, and crystallizability of the light emitting element LD may be reduced due to the surface defect of the semiconductor core NR.

Therefore, even though a defect part exists such as a vacancy on the surface of the semiconductor core NR, the light emitting element LD according to one or more embodiments may reduce the concentration of the vacancy by the atom configuring the protective layer PVL. Therefore, the lattice defect of the surface of the semiconductor core NR may be minimized or reduced. Thus, the life, efficiency, and crystallizability of the light emitting element LD may be improved.

In one or more embodiments, the semiconductor core NR may include a first lattice point Vx. When the semiconductor core NR is formed, the first lattice point Vx may exist as the vacancy due to lack of the atom. The first lattice point Vx may exist between the fourth atoms Yb adjacent to each other. When the protective layer PVL is formed on the surface of the semiconductor core NR, the first atom Xa configuring the protective layer PVL may be provided at the first lattice point Vx. In this case, the first atom Xa may form a chemical bond with the fourth atoms Yb at the first lattice point Vx.

Hereinafter, another example embodiment will be described. In the following embodiment, the same components as the already described components will be referred to by the same reference numerals, and repetitive description may be omitted or simplified, as a person of ordinary skill in the art will be able to understand and appreciate such components from the description provided above.

Figure 8:
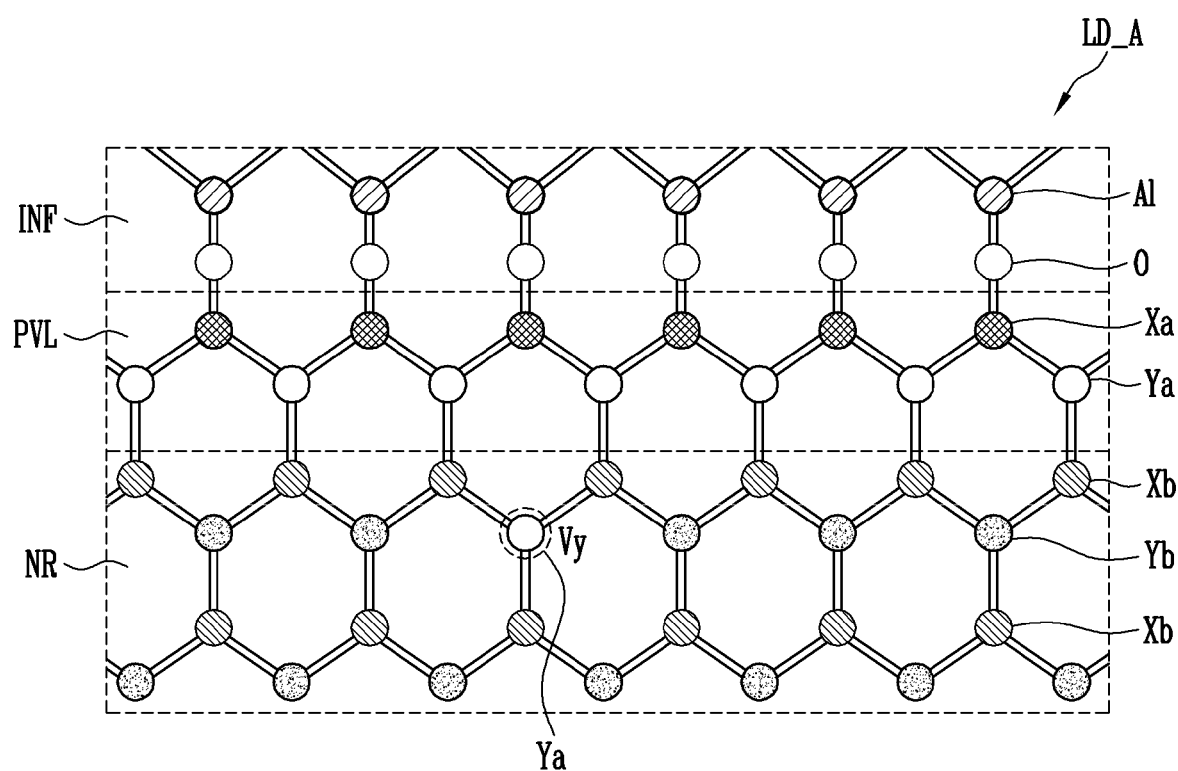
FIG. 8 is an enlarged cross-sectional view of the region A of the light emitting element according to one or more embodiments of the present disclosure.

FIG. 8 is an enlarged cross-sectional view of the region A of the light emitting element according to one or more embodiments of the present disclosure.

Referring to FIG. 8, the light emitting element LD_A according to the present embodiment is different from the embodiment of FIGS. 1-7 in that the light emitting element LD_A includes a second lattice point Vy.

For example, the semiconductor core NR of the light emitting element LD_A may include the second lattice point Vy. When the semiconductor core NR is formed, the second lattice point Vy may exist as the vacancy due to the lack of the atom.

In one or more embodiments, the second lattice point Vy may exist between the third atoms Xb adjacent to each other. When the protective layer PVL is directly formed on the surface of the semiconductor core NR, the second atom Ya configuring the protective layer PVL may be provided at the second lattice point Vy. In one or more embodiments, the second atom Ya may form a chemical bond with the third atoms Xb at the second lattice point Vy.

In one or more embodiments, the first atom Xa may be a Group 3 element, and the second atom Ya may be a Group 5 element. For example, the first atom Xa may include at least one of B, Al, Ga, and In, and the second atom Ya may include at least one of N, P, As, and Sb, but the present disclosure is not necessarily limited thereto.

In one or more embodiments, the third atom Xb may be substantially the same as the first atom Xa described above, and the fourth atom Yb may be substantially the same as the second atom Ya described above. For example, the third atom Xb may be a Group 3 element, and the fourth atom Yb may be a Group 5 element. For example, the third atom Xb may include at least one of B, Al, Ga, and In, and the fourth atom Yb may include at least one of N, P, As, and Sb, but the present disclosure is not necessarily limited thereto.

In one or more embodiments, even though the atom of the second lattice point Vy of the semiconductor core NR is partially absent by the etch process, the light emitting element LD_A according to the one or more embodiments may reduce the concentration of the vacancy because the second atom Ya configuring the protective layer PVL is provided at the second lattice point Vy. Therefore, the life, efficiency, and crystallizability of the light emitting element LD_A may be improved as described above.

In one or more embodiments, because the semiconductor core NR, the protective layer PVL, and/or the insulating layer INF have/has been described with reference to FIG. 7, repetitive description may be omitted, as a person of ordinary skill in the art will be able to understand or appreciate such components from the description provided above.

Figure 9:
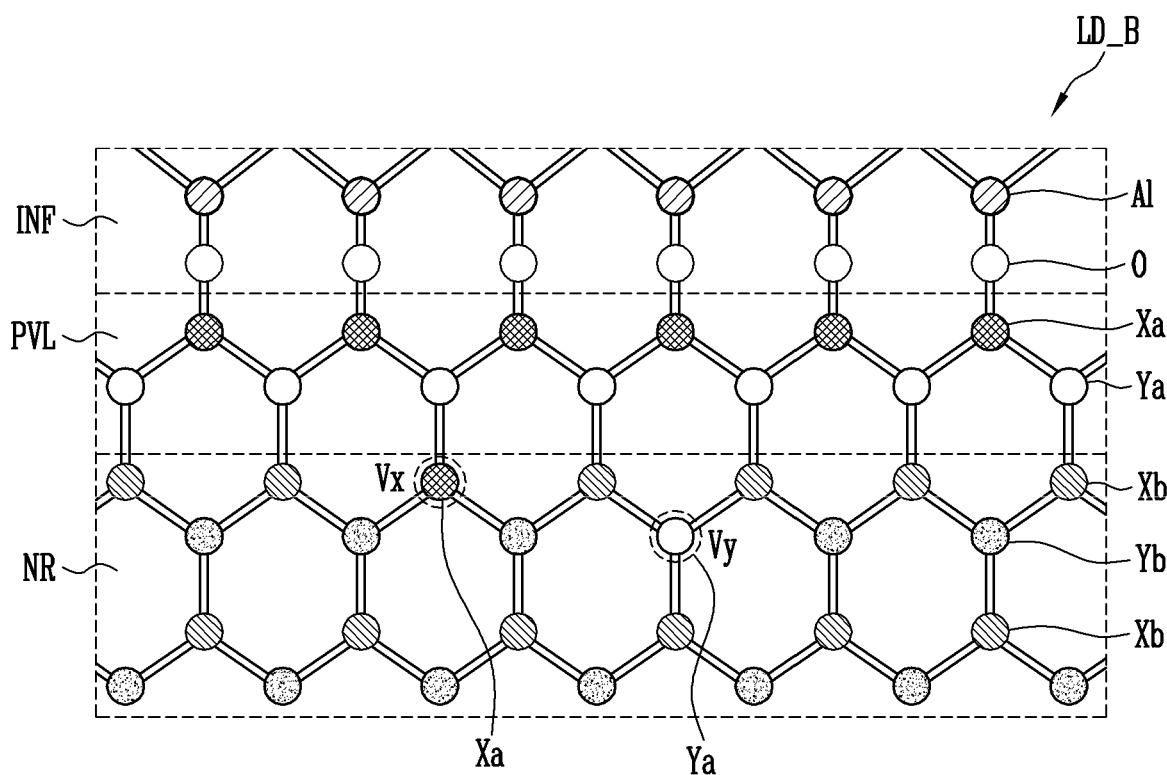
FIG. 9 is an enlarged cross-sectional view of the region A of the light emitting element according to one or more embodiments of the present disclosure.

FIG. 9 is an enlarged cross-sectional view of the region A of the light emitting element according to one or more embodiments of the present disclosure.

Referring to FIG. 9, the light emitting element LD_B according to the present embodiment is different from the embodiment of FIGS. 1-7 in that the light emitting element LD_B includes the first lattice point Vx and the second lattice point Vy.

For example, the semiconductor core NR of the light emitting element LD_B may include the first lattice point Vx and the second lattice point Vy. When the semiconductor core NR is formed, the first lattice point Vx and the second lattice point Vy may exist as the vacancy due to the lack of the atom.

In one or more embodiments, the first lattice point Vx may exist between the fourth atoms Yb adjacent to each other. When the protective layer PVL is formed on the surface of the semiconductor core NR, the first atom Xa configuring the protective layer PVL may be provided at the first lattice point Vx. In the example embodiment, the first atom Xa may form a chemical bond with the fourth atoms Yb at the first lattice point Vx.

In one or more embodiments, the second lattice point Vy may exist between the third atoms Xb adjacent to each other. When the protective layer PVL is directly formed on the surface of the semiconductor core NR, the second atom Ya configuring the protective layer PVL may be provided at the second lattice point Vy. In the example embodiment, the second atom Ya may form a chemical bond with the third atoms Xb at the second lattice point Vy.

In one or more embodiments, the first atom Xa may be a Group 3 element, and the second atom Ya may be a Group 5 element. For example, the first atom Xa may include at least one of B, Al, Ga, and In, and the second atom Ya may include at least one of N, P, As, and Sb, but the present disclosure is not necessarily limited thereto.

In one or more embodiments, the third atom Xb may be substantially the same as the first atom Xa described above, and the fourth atom Yb may be substantially the same as the second atom Ya described above. For example, the third atom Xb may be a Group 3 element, and the fourth atom Yb may be a Group 5 element. For example, the third atom Xb may include at least one of B, Al, Ga, and In, and the fourth atom Yb may include at least one of N, P, As, and Sb, but the present disclosure is not necessarily limited thereto.

In one or more embodiments, even though the atom of the first lattice point Vx and the second lattice point Vy of the semiconductor core NR is partially absent by the etch process, the light emitting element LD_B according to the example embodiments may reduce the concentration of the vacancy because the first atom Xa configuring the protective layer PVL is provided at the first lattice point Vx and the second atom Ya configuring the protective layer PVL is provided at the second lattice point Vy. Therefore, the life, efficiency, and crystallizability of the light emitting element LD_B may be improved as described above.

In one or more embodiments, because the semiconductor core NR, the protective layer PVL, and/or the insulating layer INF have/has been described with reference to FIG. 7, repetitive description may be omitted, as a person of ordinary skill in the art will be able to understand or appreciate such components from the description provided above.

Figure 10:
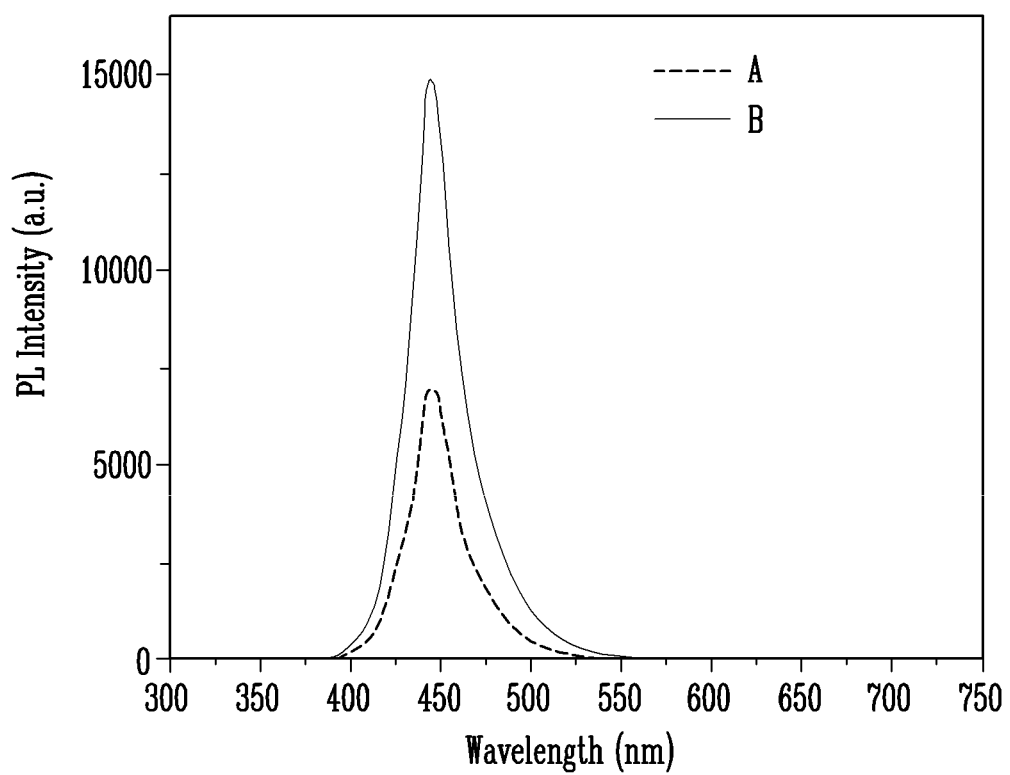
FIG. 10 is a graph illustrating a luminance difference of light emitting elements according to one or more embodiments of the present disclosure and a comparative example.

FIG. 10 is a graph illustrating a luminance difference of light emitting elements according to one or more embodiments of the present disclosure and a comparative example. An x-axis of FIG. 10 represents a wavelength, and a y-axis represents a luminous intensity (PL intensity). In FIG. 10, "A" shows a luminance of the light emitting element according to the comparative example, and "B" shows a luminance of the light emitting element according to one or more embodiments.

Figure 11:
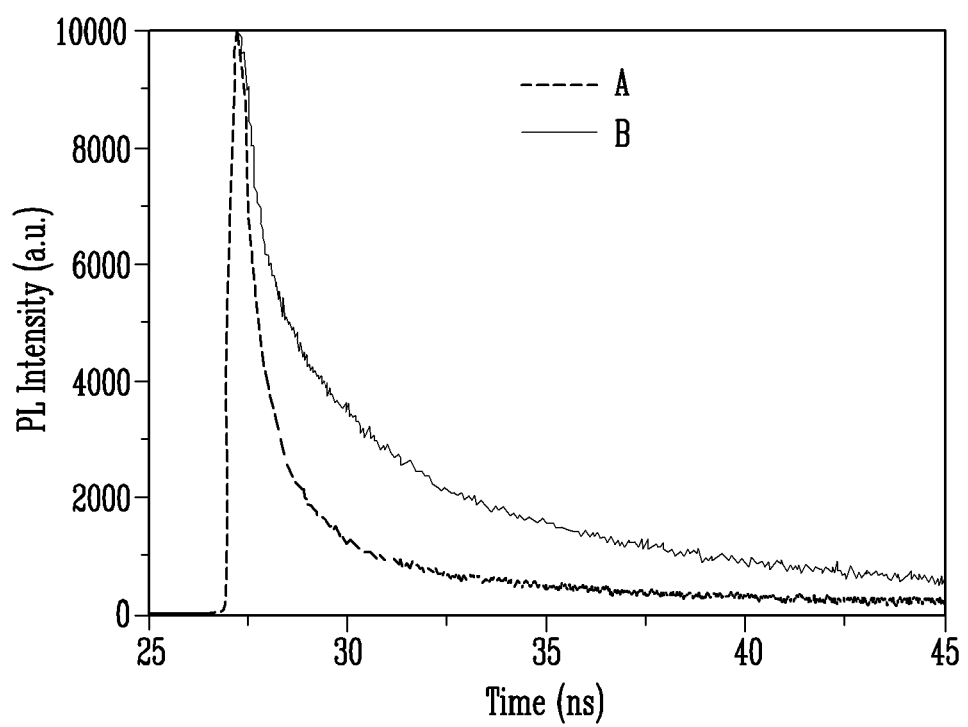
FIG. 11 is a graph illustrating a life difference between the light emitting elements according to one or more embodiments of the present disclosure and the comparative example.

FIG. 11 is a graph illustrating a life difference between the light emitting elements according to one or more embodiments of the present disclosure and the comparative example. An x-axis of FIG. 11 represents a time, and a y-axis represents a luminous intensity (PL intensity). In FIG. 11, "A" shows the life of the light emitting element according to the comparative example, and "B" shows the life of the light emitting element according to one or more embodiments.

Figure 12:
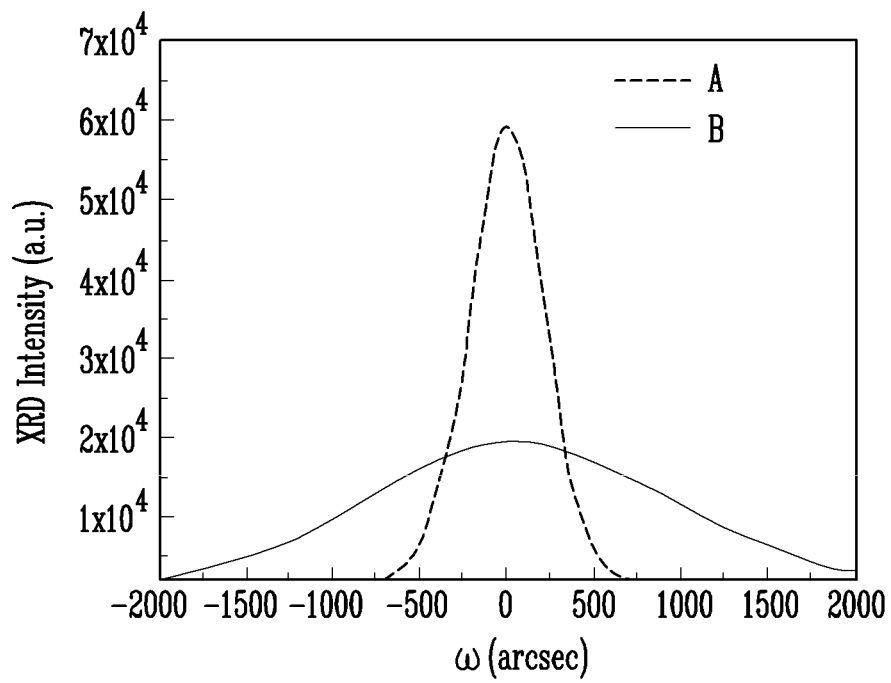
FIG. 12 is a graph illustrating a crystallizability difference of the light emitting elements according to one or more embodiments of the present disclosure and the comparative example.

FIG. 12 is a graph illustrating a crystallizability difference of the light emitting elements according to one or more embodiments of the present disclosure and the comparative example. An x-axis of FIG. 12 represents an incident angle w, and a y-axis represents an X-ray diffraction intensity (XRD intensity). In FIG. 12, "A" shows the crystallizability of the light emitting element according to the comparative example, and "B" shows the crystallizability of the light emitting element according to one or more embodiments.

Referring to FIGS. 10-12, in a case of the light emitting element according to the above-described embodiment (B), compared to a case where the protective layer PVL is omitted (A), because the concentration of the vacancy of the semiconductor core NR may be reduced or the defect part may be protected, the life, efficiency, and crystallizability of the light emitting element may be improved.

Hereinafter, a method of manufacturing the above-described light emitting element LD will be described.

Figure 13:
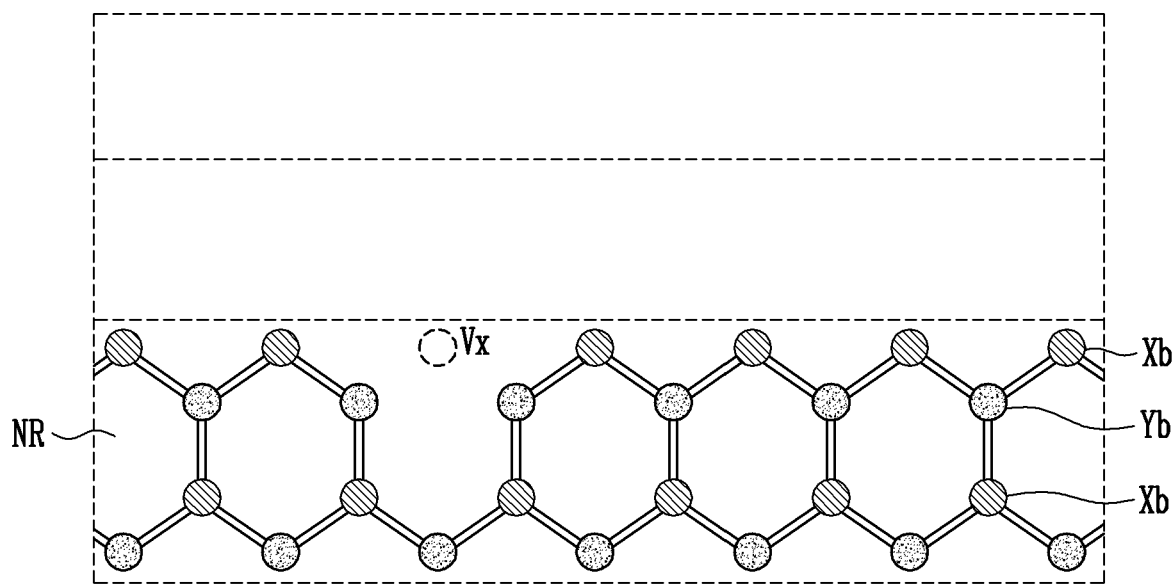
FIGS. 13-15 are enlarged cross-sectional views schematically illustrating a manufacturing process of the light emitting element, according to one or more embodiments of the present disclosure.
Figure 14:
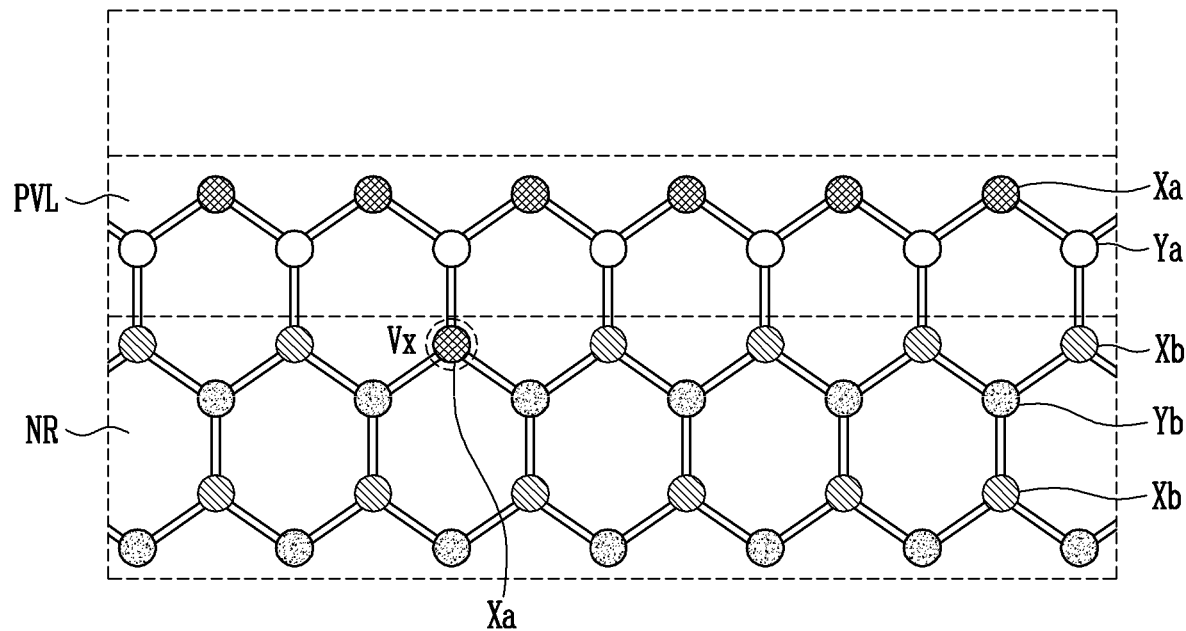
Figure 15:
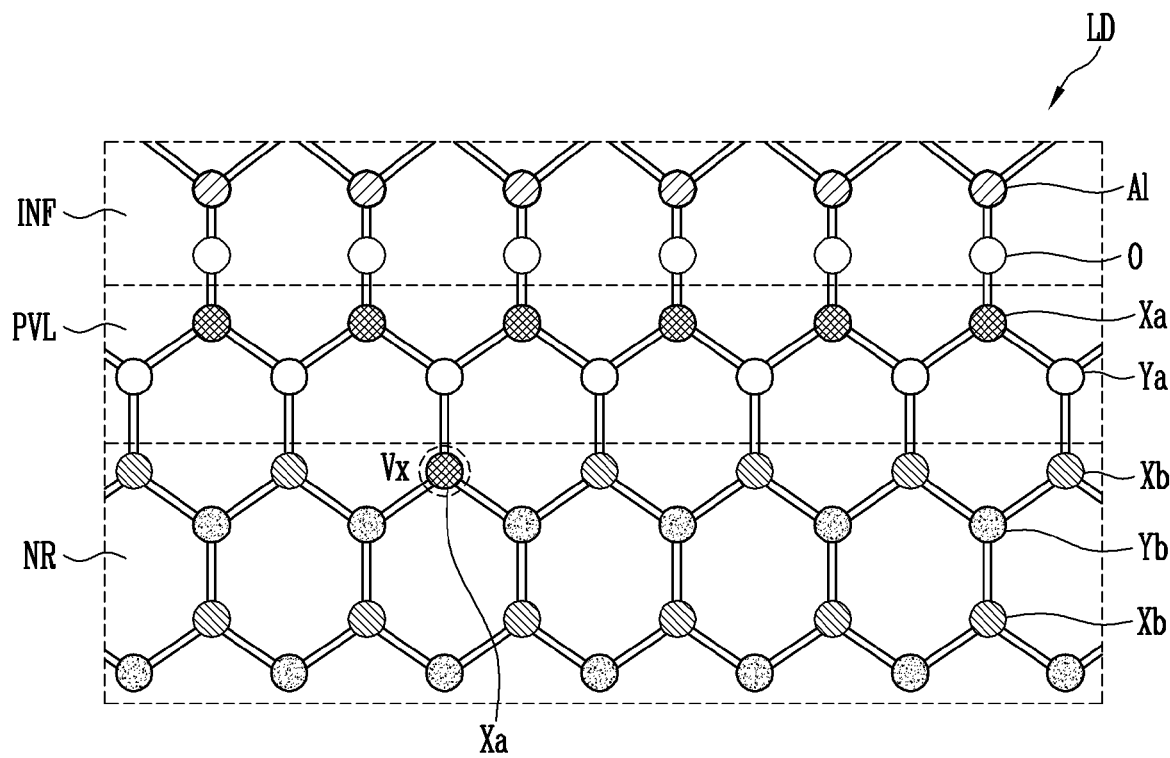

FIGS. 13-15 are enlarged cross-sectional views schematically illustrating a manufacturing process of the light emitting element LD, according to one or more embodiments of the present disclosure. FIGS. 13-15 are cross-sectional views for describing a method of manufacturing the light emitting element of FIG. 7. The same components as those of FIG. 7 will be denoted by the same reference numerals and detailed reference numerals may be omitted, as a person of ordinary skill in the art will be able to understand or appreciate such components from the description provided above.

Referring to FIG. 13, first, the semiconductor core NR is formed. In one or more embodiments, the semiconductor core NR may be formed on the substrate. The substrate may include a ZnO substrate having a GaAs layer on a surface thereof. In one or more embodiments, a Ge substrate having a GaAs layer on the surface of the substrate and a Si substrate having a GaAs layer with a buffer layer interposed therebetween may be applied to the substrate.

In one or more embodiments, the substrate may use a commercially available single crystal substrate produced by a suitable manufacturing method that is known to those skilled in the art. When a selection ratio for manufacturing the light emitting element LD is satisfied and epitaxial growth may be smoothly performed, a material of the substrate is not particularly limited. A sacrificial layer may be further formed on the substrate. The sacrificial layer may be formed by a metal organic chemical vapor deposition (MOCVD) method, a molecular beam epitaxy (MBE) method, a vapor-phase epitaxy (VPE) method, a liquid-phase epitaxy (LPE) method, or the like.

In one or more embodiments, a first semiconductor material layer, an active material layer, and a second semiconductor material layer may be sequentially formed on the substrate and may be etched to form the semiconductor core NR. Because the first semiconductor material layer may include a material substantially the same as the material configuring the first semiconductor layer 11 described above, repetitive description may be omitted, as a person of ordinary skill in the art will be able to understand or appreciate such components from the description provided above. For example, because the active material layer may include a material substantially the same as the material configuring the active layer 12 described above, overlapping description may be omitted. For example, because the second semiconductor material layer may include a material substantially the same as the material configuring the second semiconductor layer 13 described above, overlapping description may be omitted.

In one or more embodiments, an etch process may be performed after a mask is disposed on the first semiconductor material layer, the active material layer, and the second semiconductor material layer, to form a plurality of semiconductor cores NR by patterning at a nano scale or micro scale interval. As described above, in the process of etching the first semiconductor material layer, the active material layer, and the second semiconductor material layer, the atom may be partially absent at the first lattice point Vx, or the like, and the vacancy or the dangling bond may be generated. Such a defect part may act as a factor of reducing or lowering the life, efficiency, and crystallizability of the light emitting element LD.

Therefore, as shown in FIG. 14, the protective layer PVL may be formed on the semiconductor core NR to reduce the concentration of the vacancy or to protect the defect part.

For example, the protective layer PVL may be formed by a solution-based method. Hereinafter, the solution-based method will be described based on a hot-injection method. The protective layer PVL may be manufactured by mixing and heating a solution manufactured by mixing a reaction precursor, a surfactant, and the like, together with the semiconductor core NR. Heating of the mixed solution may be performed in several steps. For example, degas may be performed at a heating process and then a temperature may be increased to 100° C. to 400° C. which are growth temperatures. In one or more embodiments, the temperature may be increased to 200° C. to 300° C.

As described above, when the first atom Xa of the protective layer PVL is a Group 3 element, the reaction precursor may include at least one of III M (e.g., III: at least one of B, Al, Ga, and In, M: at least one of Cl, Br, I, acetate, and acetylacetone).

In one or more embodiments, when the second atom Ya of the protective layer PVL is a Group 5 element, the reaction precursor may include at least one of VN (e.g., V: at least one of N, P, As, and Sb, N: at least one of hexamethyldisilazane, Tris(trimethylsilyl)amine, N,N-Bis(trimethylsilyl)methylamine).

In one or more embodiments, the surfactant may include at least one of oleyamine, oleic acid, hexadecylamine, and dodecylamine, but is not necessarily limited thereto.

In one or more embodiments, the protective layer PVL may be formed according to the following reaction formula, but a reactant is not limited to a material illustrated in the following reaction formula.

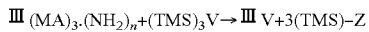

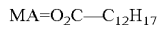

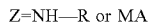

The first atom Xa of the protective layer PVL may be provided at the first lattice point Vx of the semiconductor core NR by a reaction between the Group 3 reaction precursor and the surface of the semiconductor core NR. For example, the first atom Xa of the protective layer PVL may bond with the fourth atoms Yb of the semiconductor core NR at the first lattice point Vx. Therefore, because the concentration of the vacancy of the semiconductor core NR may be reduced or the defect part may be protected, the life, efficiency, and crystallizability of the light emitting element LD may be improved as described above.

As described above, when the protective layer PVL is formed by the solution-based method, in particular, the hot injection method, economic efficiency may be secured as compared to other processes. For example, when the protective layer PVL is formed by the solution-based method, a growth rate of the protective layer PVL may be controlled and process cost may be minimized or reduced as compared to an atomic layer deposition (ALD) method. However, a method of forming the protective layer PVL is not necessarily limited thereto, and the protective layer PVL may be formed by a chemical vapor deposition (CVD), atomic layer deposition (ALD), or molecular beam epitaxy (MBE) method.

Referring to FIG. 15, subsequently, the insulating layer INF is further formed on the protective layer PVL to complete the light emitting element LD as shown in FIG. 7.

In one or more embodiments, the insulating layer INF may be formed by, for example, a solution-based method. When the insulating layer INF is formed by the solution-based method, for example, the hot injection method, economic efficiency may be secured as compared to other processes. For example, when the insulating layer INF is formed by the solution-based method, the thickness of the insulating layer INF may be adjusted as compared to the atomic layer deposition (ALD) method, and the process cost may be minimized or reduced. At this time, the thickness of the insulating layer INF may be formed to 50 nm or more, but is not necessarily limited thereto.

Because the solution-based method, for example, the hot injection method has been described with reference to FIG. 14, repetitive description may be omitted, as a person of ordinary skill in the art will be able to understand or appreciate such components from the description provided above.

According to one or more embodiments, the insulating layer INF may be formed by a chemical vapor deposition (CVD), atomic layer deposition (ALD), or molecular beam epitaxy (MBE) method. For example, when the insulating layer INF is formed by the atomic layer deposition (ALD) method, the insulating layer INF may be formed using chemical adsorption and desorption by supplying trimethyl aluminum (TMA) and an $H_2O$ as reaction source in a pulse form. However, the present disclosure is not necessarily limited thereto.

In one or more embodiments, a light emitting device including the light emitting element LD according to one or more embodiments may be used in various kinds of devices that require a light source, including a display device. For example, at least one light emitting element LD, for example, a plurality of light emitting elements LD each having a size from nano scale to micro scale, may be disposed in each pixel area of a display panel, and the light source (or a light source unit) of each pixel may be configured using the light emitting element LD. However, an application field of the light emitting element LD is not limited to the display device in the present disclosure. For example, the light emitting element LD may be used in other kinds of devices that require a light source, such as a lighting device. Hereinafter, a display device including the light emitting element LD according to one or more embodiments will be described in detail with reference to FIGS. 16-23.

Figure 16:
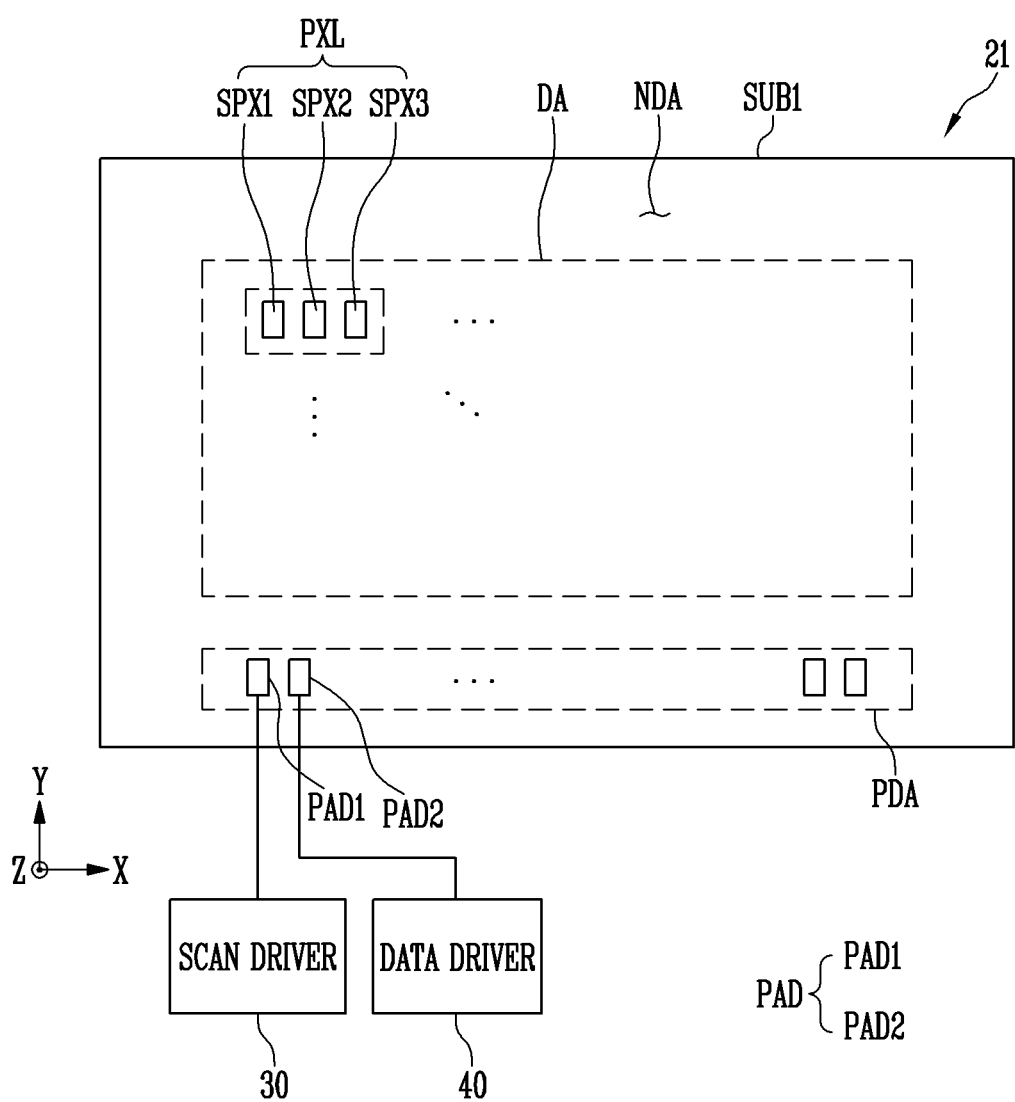
FIG. 16 is a conceptual diagram illustrating a display device, according to one or more embodiments of the present disclosure.

FIG. 16 is a conceptual diagram illustrating the display device according to one or more embodiments of the present disclosure.

Referring to FIG. 16, the display device may include a display panel 21, a scan driver 30, and a data driver 40.

In one or more embodiments, the scan driver 30 and the data driver 40 may be positioned outside the display panel 21. Each of the scan driver 30 and the data driver 40 may be connected to the display panel 21 by a plurality of signal lines. However, the present disclosure is not limited thereto, and the scan driver 30 and the data driver 40 may be positioned inside the display panel 21.

In one or more embodiments, the display panel 21 may have a planar rectangular shape. The display panel 21 may include both short sides extending in a second direction (Y-axis direction) and both long sides extending in a first direction (X-axis direction) crossing the second direction (Y-axis direction). A corner portion where the long side and the short side of the flat display panel 21 meet may be a right angle (or substantially or generally a right angle) in a plan view, but is not limited thereto, and may have a rounded curved shape. The planar shape of the display panel 21 is not limited to that illustrated, and may have a square, a circle, an ellipse, or other shape.

In one or more embodiments, the display panel 21 may include a substrate SUB1 and a pixel PXL defined on the substrate SUB1.

In one or more embodiments, the substrate SUB1 may configure a base member of the display panel 21. For example, the substrate SUB1 may configure a base member of a lower panel (for example, a lower plate of the display panel 21).

In one or more embodiments, the substrate SUB1 may be a rigid substrate or a flexible substrate, and a material or a physical property thereof is not particularly limited. For example, the substrate SUB1 may be a rigid substrate configured of glass, tempered glass, or various wafers, or a flexible substrate configured of a thin film of a plastic or metal material.

In one or more embodiments, the substrate SUB1 may include a display area DA in which the pixel PXL is disposed, and a non-display area NDA. According to one or more embodiments, the display area DA may be disposed in a center area of the display panel 21, and the non-display area NDA may be disposed along an edge of the display panel 21 to surround the display area DA. However, positions of the display area DA and the non-display area NDA are not limited thereto, and the positions thereof may be changed.

In one or more embodiments, the pixel PXL may include at least one light emitting element LD driven by a corresponding scan signal and a data signal, for example, the light emitting element LD of FIGS. 1-7, for example, at least one rod-shaped light emitting diode by any one of the embodiments. For example, the pixel PXL may include a plurality of rod-shaped light emitting diodes having a size as small as nano scale to micro scale and connected in parallel with each other. The plurality of rod-shaped light emitting diodes may configure a light source of the pixel PXL.

In one or more embodiments, the pixel PXL may include a first sub pixel SPX1, a second sub pixel SPX2, and a third sub pixel SPX3. The first sub pixel SPX1, the second sub pixel SPX2, and the third sub pixel SPX3 may emit light with different colors. For example, the first sub pixel SPX1 may be a red sub pixel emitting light of red color, the second sub pixel SPX2 may be a green sub pixel emitting light of green color, and the third sub pixel SPX3 may be a blue sub pixel emitting light of blue color. However, a color, a type, and/or the number of sub pixels SPX1, SPX2, and SPX3 configuring the pixel PXL are/is not particularly limited and may be variously changed. For example, FIG. 16 illustrates a case where the pixel PXL is arranged in a stripe form in the display area DA, but the present disclosure is not necessarily limited thereto.

In one or more embodiments, the non-display area NDA of the substrate SUB1 may include a pad area PDA in which a plurality of pads PAD1 and PAD2 are disposed. The pad area PDA may be disposed to be adjacent to one side edge of the display area DA in the non-display area NDA. In FIG. 16, although the pad area PDA is disposed adjacent to a lower side edge of the display area DA, the pad area PDA is not necessarily limited thereto.

In one or more embodiments, a pad PAD may include a plurality of pads PAD1 and PAD2. The plurality of pads PAD1 and PAD2 may include a first pad PAD1 and a second pad PAD2. For example, the first pad PAD1 may be a gate pad and the second pad PAD2 may be a data pad. The first pad PAD1 may be connected to the scan driver 30 positioned outside the display panel 21. Therefore, a scan signal applied from the scan driver 30 may be transferred to a scan line through the first pad PAD1.

In one or more embodiments, the second pad PAD2 may be connected to the data driver 40 positioned outside the display panel 21. Therefore, a data signal applied from the data driver 40 may be transferred to a data line through the second pad PAD2.

Figure 17:
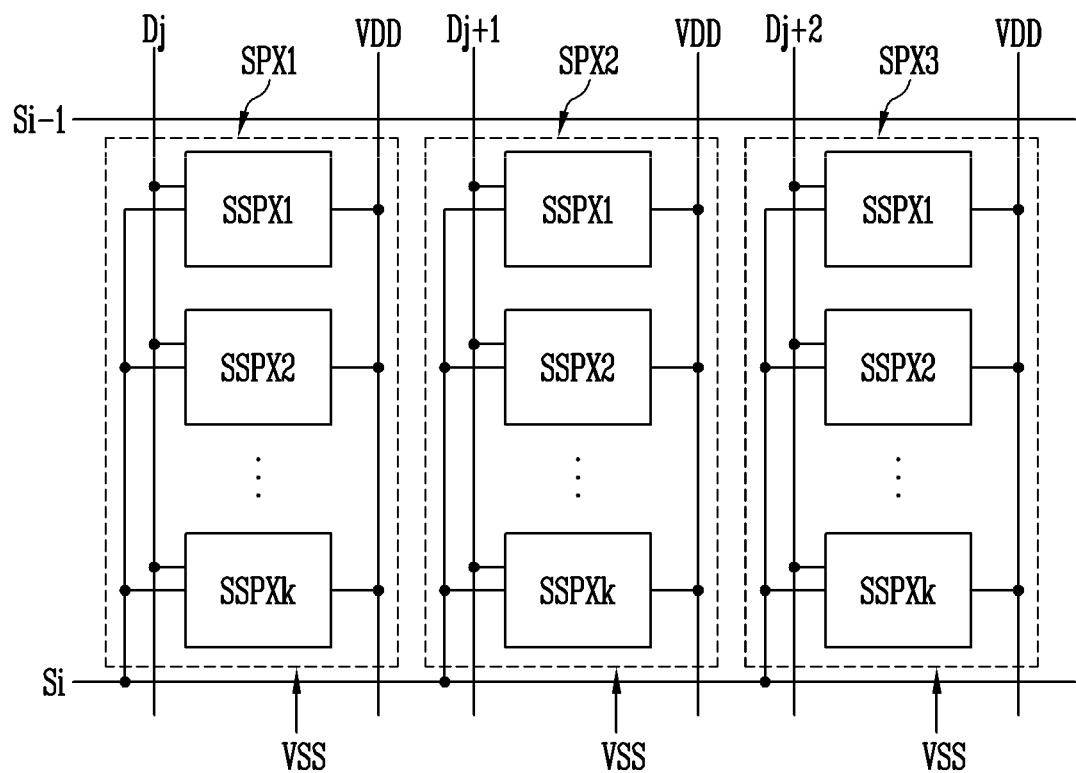
FIG. 17 is a circuit diagram illustrating an example of a sub pixel of FIG. 16, according to one or more embodiments of the present disclosure.

FIG. 17 is a circuit diagram illustrating an example of the sub pixel of FIG. 16, according to one or more embodiments of the present disclosure.

Because the first to third sub pixels SPX1, SPX2, and SPX3 may be substantially the same or similar to each other except that the first to third sub pixels SPX1, SPX2, and SPX3 are connected to corresponding data lines Dj, Dj+1, and Dj+2, respectively, the first to third sub pixels SPX1, SPX2, and SPX3 will be comprehensively described based on the first sub pixel SPX1.

In one or more embodiments, the first to third sub pixels SPX1, SPX2, and SPX3 may be disposed in regions partitioned by scan lines Si−1 and Si (where i is a natural number) and data lines Dj, Dj+1 and Dj+2 (where j is a natural number), respectively. For example, the first sub pixel SPX1 may be disposed in a region partitioned by (i−1)-th and i-th scan lines Si−1 and Si and j-th and (j+1)-th data lines Dj and Dj+1. However, a disposition of the first to third sub pixels SPX1, SPX2, and SPX3 is not limited thereto.

In one or more embodiments, the first sub pixel SPX1 may be connected to the scan line Si and the data line Dj and may be connected to a first power line and a second power line. First power VDD may be applied to the first power line, second power VSS may be applied to the second power line, and each of the first and second power lines may be a common line connected to a plurality of sub pixels (e.g., first to third sub pixels SPX1, SPX2, and SPX3). Although not shown in FIG. 17, in one or more embodiments, second power line may be connected to the first to third sub pixels SPX1, SPX2, and SPX3 to supply second power VSS to the sub pixels. The first and second power VDD and VSS may have different potentials so that the first sub pixel SPX1 emits light, and the first power VDD may have a voltage level higher than a voltage level of the second power VSS.

In one or more embodiments, the first sub pixel SPX1 may include at least one unit pixel SSPX1 to SSPXk (where k is a natural number).

In one or more embodiments, each of the unit pixels SSPX1 to SSPXk may be connected to the scan line Si and the data line Dj and may be connected to the first power line and the second power line. Each of the unit pixels SSPX1 to SSPXk may emit light at a luminance corresponding to a data signal transmitted through the data line Dj in response to a scan signal transmitted through the scan line Si. The unit pixels SSPX1 to SSPXk may include substantially the same pixel structure or pixel circuit.

In one or more embodiments, each of the unit pixels SSPX1 to SSPXk (or the sub pixels SPX1 to SPX3) may be configured as an active pixel. However, the present disclosure is not necessarily limited thereto, and the unit pixels SSPX1 to SSPXk may be configured as a pixel of the display panel 21 having various passive or active structures that is known to those skilled in the art.

FIGS. 18-21 are circuit diagrams illustrating an example that may be applied to the unit pixel of FIG. 17, according to one or more embodiments of the present disclosure.

In one or more embodiments, the first to k-th unit pixels SSPX1 to SSPXk have substantially the same or similar structure. The first unit pixel SSPX1 shown in FIG. 17 is an example, and may be identically or similarly applied to any one of the first to k-th unit pixels SSPX1 to SSPXk of FIG. 18.

Figure 18:
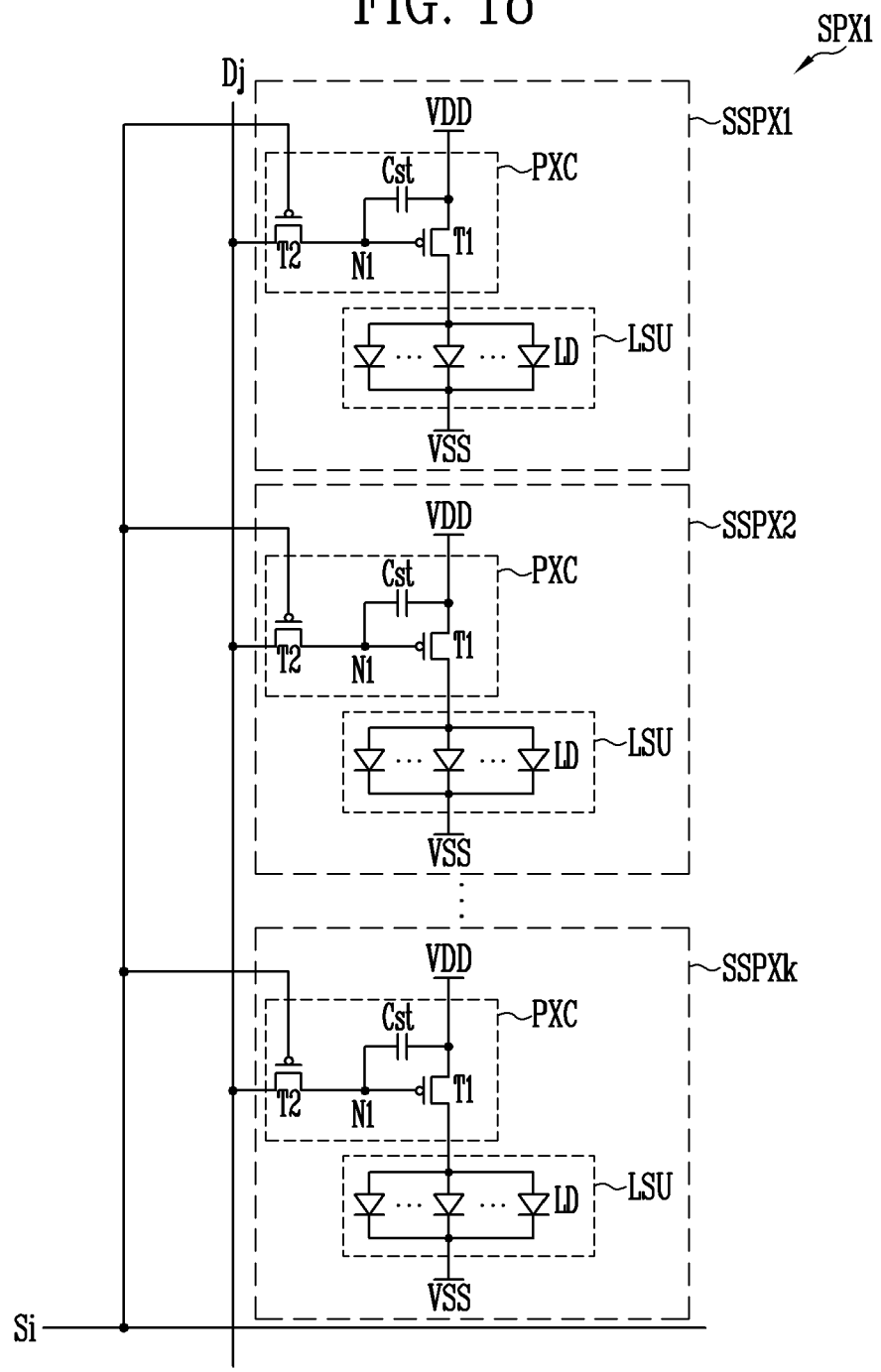
FIGS. 18-21 are circuit diagrams illustrating an example that may be applied to a unit pixel of FIG. 17, according to one or more embodiments of the present disclosure.

Referring to FIG. 18, the first unit pixel SSPX1 may include a light source unit LSU that emits light at a luminance corresponding to a data signal. In one or more embodiments, the first unit pixel SSPX1 may selectively further include a pixel circuit PXC for driving the light source unit LSU.

In one or more embodiments, the light source unit LSU may include a plurality of light emitting elements LD electrically connected between the first power VDD and the second power VSS. The light emitting elements LD may be connected in a parallel structure with each other, but is not limited thereto. For example, the plurality of light emitting elements LD may be connected in a parallel structure between the first power VDD and the second power VSS.

In one or more embodiments, the first power VDD and the second power VSS may have different potentials so that the light emitting elements LD may emit light. For example, the first power VDD may be set as a high potential power and the second power VSS may be set as a low potential power. For example, a potential difference between the first power VDD and the second power VSS may be set to be equal to or greater than a threshold voltage of the light emitting elements LD during an emission period of the first unit pixel SSPX1 (or the first sub pixel SPX1).

In one or more embodiments, although FIG. 18 shows an embodiment in which the light emitting elements LD are connected in parallel to each other in the same direction (for example, a forward direction) between the first power VDD and the second power VSS, the present disclosure is not necessarily limited thereto. For example, some of the light emitting elements LD may be connected in the forward direction between the first power VDD and the second power VSS to form respective effective light sources, and the other may be connected in reverse direction. As another example, the first unit pixel SSPX1 may include only a single light emitting element LD (for example, a single effective light source connected in the forward direction between the first power VDD and the second power VSS).

In one or more embodiments, one end portion of each of the light emitting elements LD may be commonly connected to a corresponding pixel circuit PXC through the first electrode of the light emitting element LD, and may be connected to the first power VDD through the pixel circuit PXC and the first power line. The other end portion of each of the light emitting elements LD may be commonly connected to the second power VSS through the second electrode of the light emitting element LD and the second power line.

In one or more embodiments, the light source unit LSU may emit light at a luminance corresponding to a driving current supplied through the corresponding pixel circuit PXC. Therefore, an image (e.g., a set image or a predetermined image) may be displayed in the display area DA of FIG. 16.

In one or more embodiments, the pixel circuit PXC may be connected to a scan line Si and a data line Dj of a corresponding sub pixel (for example, the first sub pixel SPX1). For example, when the first sub pixel SPX1 is disposed in an i-th row and a j-th column of the display area DA, the pixel circuit PXC of the first unit pixel SSPX1 may be connected to an i-th scan line Si and a j-th data line Dj of the display area DA.

In one or more embodiments, the pixel circuit PXC may include first and second transistors T1 and T2 and a storage capacitor Cst.

In one or more embodiments, the first transistor T1 (or a driving transistor) may be connected between the first power VDD and the light source unit LSU. A gate electrode of the first transistor T1 may be connected to a first node N1. The first transistor T1 may control a driving current supplied to the light source unit LSU in correspondence with (or according to) a voltage of the first node N1.

In one or more embodiments, the second transistor T2 (or a switching transistor) may be connected between the data line Dj and the first node N1. A gate electrode of the second transistor T2 may be connected to the scan line Si.

In one or more embodiments, the second transistor T2 may be turned on in response to a scan signal of a gate-on voltage (for example, a low voltage) from the scan line Si to electrically connect the data line Dj and the first node N1 to each other.

In one or more embodiments, a data signal of a corresponding frame may be supplied to the data line Dj during every frame period, and the data signal may be transferred to the first node N1 via the second transistor T2. Therefore, a voltage corresponding to the data signal may be charged in the storage capacitor Cst.

In one or more embodiments, one electrode of the storage capacitor Cst may be connected to the first power VDD, and another electrode may be connected to the first node N1. The storage capacitor Cst may charge the voltage corresponding to the data signal supplied to the first node N1 during each frame period, and maintain the charged voltage until the data signal of the next frame is supplied.

In one or more embodiments, in FIG. 18, for example, the transistors (e.g., the first and second transistors T1 and T2) included in the pixel circuit PXC are shown as P-type transistors, but the present disclosure is not necessarily limited thereto. For example, at least one of the first and second transistors T1 and T2 may be changed to an N-type transistor in one or more embodiments.

Figure 19:
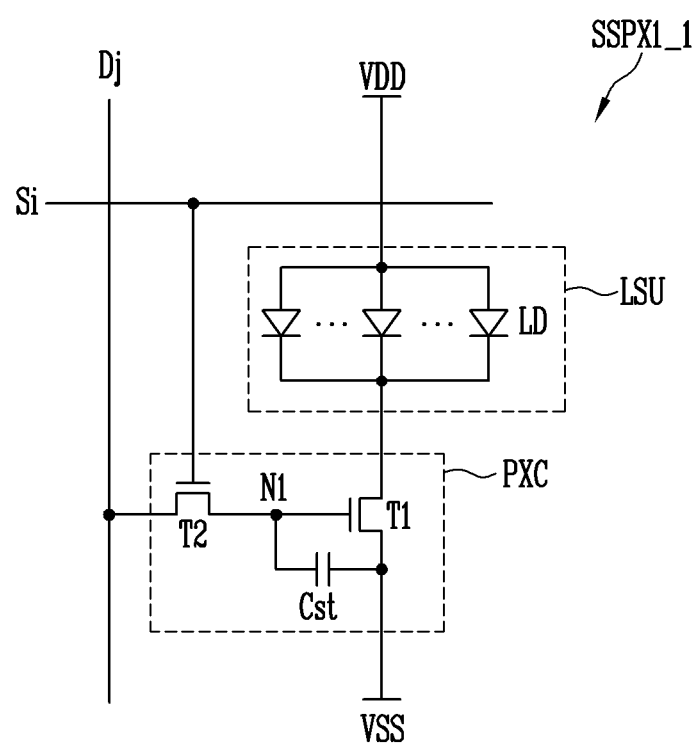

For example, as shown in FIG. 19, both of the first and second transistors T1 and T2 may be N-type transistors. In such a case, the gate-on voltage of the scan signal for writing the data signal, which is supplied to the data line Dj, to the sub pixel during each frame period may be a high level voltage. Similarly, the voltage of the data signal for turning on the first transistor T1 may be a voltage of a waveform opposite to that of the embodiment of FIG. 18. For example, in the embodiment of FIG. 19, a data signal having a higher voltage level may be supplied as a grayscale value to be expressed is increased.

A configuration and an operation of the first unit pixel SSPX1_1 shown in FIG. 19 are substantially similar to those of the first unit pixel SSPX1 of FIG. 18, except that a connection position of some circuit elements and voltage levels of control signals (for example, the scan signal and the data signal) are changed according to a transistor type change (e.g., P-type to N-type). Therefore, repetitive description may be omitted, as a person of ordinary skill in the art will be able to understand or appreciate such components from the description provided above.

In one or more embodiments, the structure of the pixel circuit PXC is not limited to the embodiment shown in FIGS. 18 and 19. For example, the pixel circuit PXC may be configured as a pixel circuit of various structures and/or driving methods. For example, the pixel circuit PXC may be configured as in an embodiment shown in FIG. 20.

Figure 20:
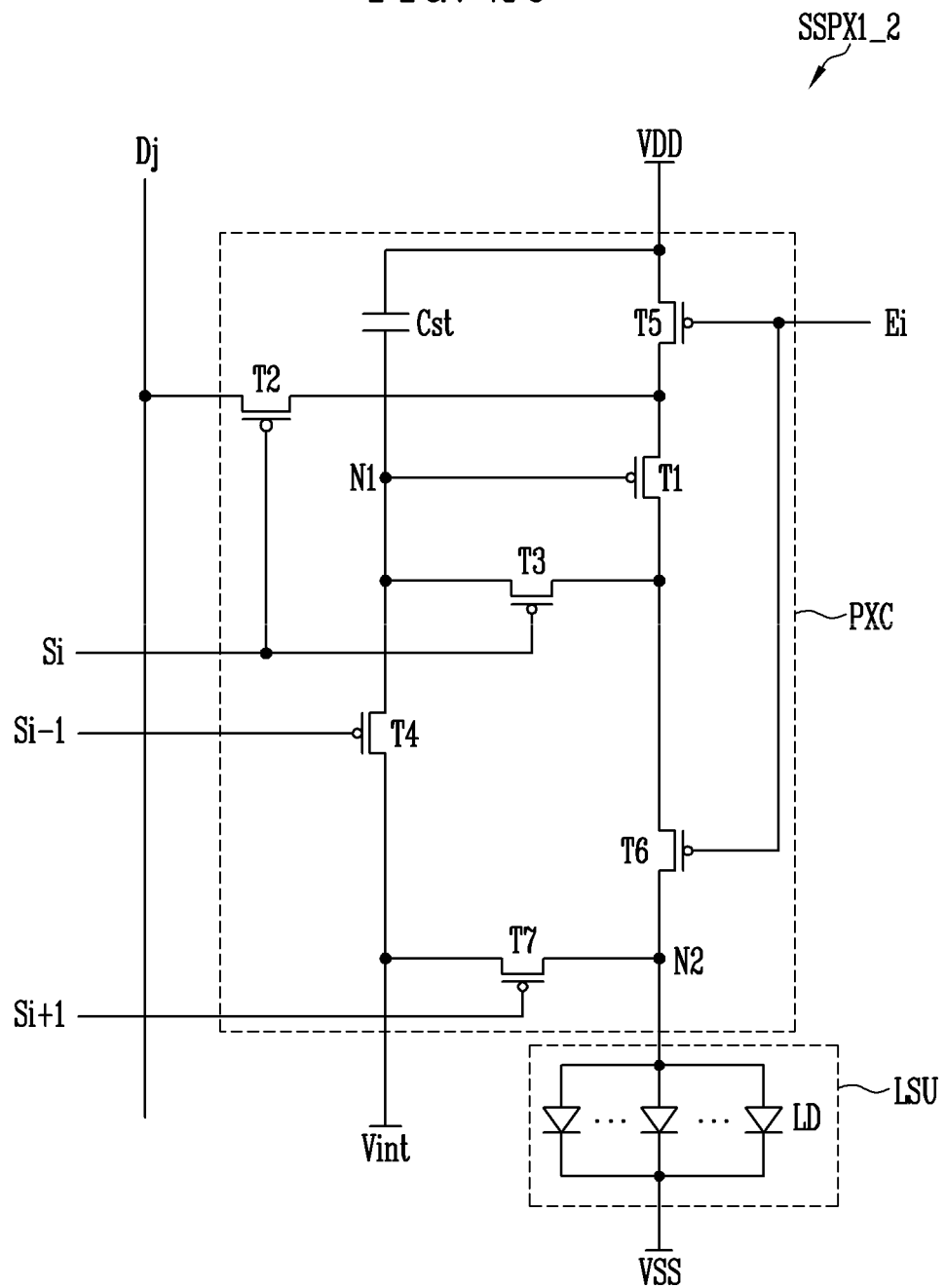

Referring to FIG. 20, the pixel circuit PXC in a first unit pixel SSPX1_2 may be further connected to at least one other scan line (or a control line) in addition to the corresponding scan line Si. In one or more embodiments, the pixel circuit PXC may be further connected to another power in addition to the first power VDD and the second power VSS. For example, the pixel circuit PXC may also be connected to an initialization power Vint.

According to one or more embodiments, the pixel circuit PXC may include seven transistors T1 to T7. For example, the pixel circuit PXC may include first to seventh transistors T1 to T7 and a storage capacitor Cst.

In one or more embodiments, the first transistor T1 may be connected between the first power VDD and the light source unit LSU. One electrode (for example, a source electrode) of the first transistor T1 may be connected to the first power VDD through the fifth transistor T5, and another electrode (for example, a drain electrode) of the first transistor T1 may be connected to one electrode of the light source unit LSU via the sixth transistor T6. A gate electrode of the first transistor T1 may be connected to a first node N1. The first transistor T1 may control the driving current supplied to the light source unit LSU in correspondence with a voltage of the first node N1.

In one or more embodiments, the second transistor T2 may be connected between the data line Dj and the one electrode of the first transistor T1 (for example, the source electrode of the first transistor T1). A gate electrode of the second transistor T2 may be connected to the corresponding scan line Si. The second transistor T2 may be turned on when the scan signal of the gate-on voltage is supplied from the scan line Si to the gate electrode of the second transistor T2 to electrically connect the data line Dj to the one electrode of the first transistor T1 (for example, the source electrode of the first transistor T1). Therefore, when the second transistor T2 is turned on, the data signal supplied from the data line Dj may be transferred to the first transistor T1.

In one or more embodiments, the third transistor T3 may be connected between the other electrode (for example, the drain electrode) of the first transistor T1 and the first node N1. A gate electrode of the third transistor T3 may be connected to the corresponding scan line Si. The third transistor T3 may be turned on when the scan signal of the gate-on voltage is supplied from the scan line Si to the gate electrode of the third transistor T3 to connect the first transistor T1 in a diode form.

In one or more embodiments, the fourth transistor T4 may be connected between the first node N1 and the initialization power Vint. A gate electrode of the fourth transistor T4 may be connected to a previous scan line, for example, an (i−1)-th scan line Si−1. The fourth transistor T4 may be turned on when the scan signal of the gate-on voltage is supplied from the (i−1)-th scan line Si−1 to the gate electrode of the fourth transistor T4 to transfer a voltage of the initialization power Vint to the first node N1. In one or more embodiments, the voltage of the initialization power Vint may be equal to or less than a lowest voltage of the data signal.

In one or more embodiments, the fifth transistor T5 may be connected between the first power VDD and the first transistor T1. A gate electrode of the fifth transistor T5 may be connected to a corresponding emission control line, for example, an i-th emission control line Ei. The fifth transistor T5 may be turned off when an emission control signal of a gate-off voltage (for example, a high voltage) is supplied to the i-th emission control line Ei, and may be turned on in other cases.

In one or more embodiments, the sixth transistor T6 may be connected between the first transistor T1 and the first electrode of the light source unit LSU (and a second node N2). A gate electrode of the sixth transistor T6 may be connected to a corresponding emission control line, for example, the i-th emission control line Ei. The sixth transistor T6 may be turned off when the emission control signal of the gate-off voltage is supplied to the i-th emission control line Ei, and may be turned on in other cases.

In one or more embodiments, the seventh transistor T7 may be connected between the first electrode of the light source unit LSU (and a second node N2) and the initialization power Vint (or a third power line for transmitting the voltage of the initialization power Vint). A gate electrode of the seventh transistor T7 may be connected to any one of next scan lines, for example, an (i+1)-th scan line Si+1. The seventh transistor T7 may be turned on when the scan signal of the gate-on voltage is supplied to the (i+1)-th scan line Si+1 to supply the voltage of the initialization power Vint to the first electrode of the light source unit LSU. In one or more embodiments, a voltage of the first electrode of the light source unit LSU may be initialized during each initialization period in which the voltage of the initialization power Vint is transferred to the light source unit LSU.

In one or more embodiments, a control signal for controlling an operation of the seventh transistor T7 may be variously changed. For example, the gate electrode of the seventh transistor T7 may be connected to a scan line of a corresponding horizontal line, for example, the i-th scan line Si. In one or more embodiments, the seventh transistor T7 may be turned on when the scan signal of the gate-on voltage is supplied to the i-th scan line Si to supply the voltage of the initialization power Vint to the one electrode of the light source unit LSU.

In one or more embodiments, the storage capacitor Cst may be connected between the first power VDD and the first node N1. The storage capacitor Cst may store a data signal supplied to the first node N1 and a voltage corresponding to the threshold voltage of the first transistor T1 in each frame period.

In one or more embodiments, in FIG. 20, all of the transistors included in the pixel circuit PXC, for example, the first to seventh transistors T1 to T7, are shown as P-type transistors, but the present disclosure is not necessarily limited thereto. For example, at least one of the first to seventh transistors T1 to T7 may be changed to an N-type transistor.

According to one or more embodiments, the pixel circuit PXC may be further connected to another line in addition to the data line Dj.

Figure 21:
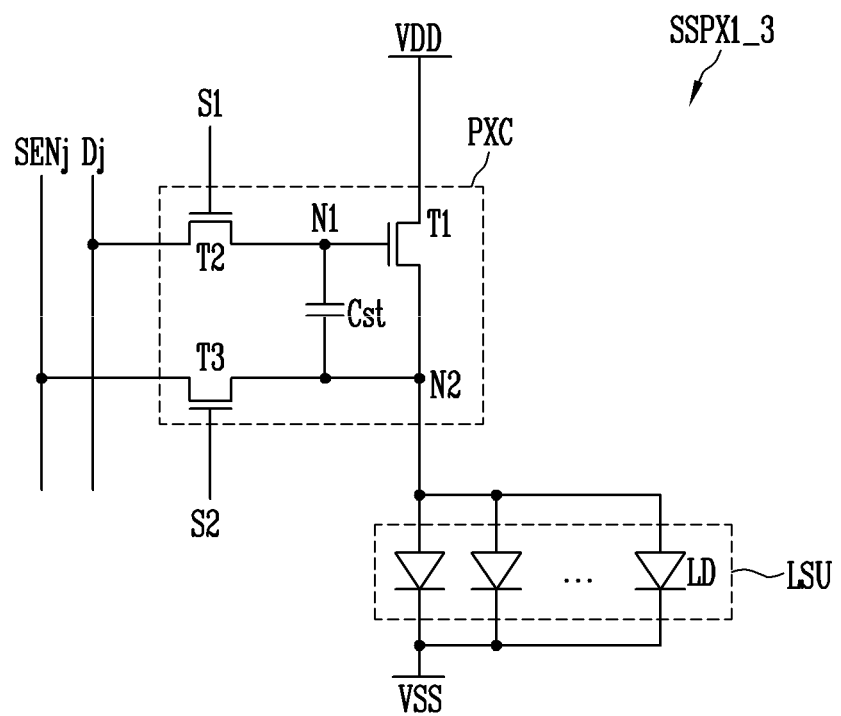

Referring to FIG. 21, in one or more embodiments, the pixel circuit PXC in a first unit pixel SSPX1_3 may be connected to a sensing line SENj. The pixel circuit PXC may include first to third transistors T1 to T3 and a storage capacitor Cst. The first and second transistors T1 and T2 and the storage capacitor Cst are substantially the same as or similar to the first and second transistors T1 and T2 and the storage capacitor Cst described with reference to FIG. 18, respectively. Therefore, repetitive description may be omitted, as a person of ordinary skill in the art will be able to understand or appreciate such components from the description provided above.

In one or more embodiments, the third transistor T3 may be connected between the sensing line SENj and a second node N2. A gate electrode of the third transistor T3 may be connected to a second scan line S2 different from the first scan line S1 (for example, a (j+1)-th scan line Sj+1 different from a j-th scan line Sj).

In one or more embodiments, the light source unit LSU may be connected between the second node N2 and the second power line (for example, a power line to which the second power VSS is applied).

In one or more embodiments, the third transistor T3 may be turned on in response to a scan signal of a gate-on voltage transmitted from the second scan line S2 to the gate electrode of the third transistor T3 to electrically connect the sensing line SENj and the second node N2 to each other.

For example, when the third transistor T3 is turned on in a state in which a driving current corresponding to a reference voltage flows through the first transistor T1, the driving current flowing through the first transistor T1 may be provided to an external sensing device through the third transistor T3 and the sensing line SENj, and a signal corresponding to a characteristic (for example, Vth) of the first transistor T1 may be output to the outside (e.g., to an external sensing device) through the sensing line SENj based on the driving current.

In one or more embodiments, a structure of the first unit pixel SSPX1 that may be applied to example embodiments of the present disclosure is not limited to the embodiments shown in FIGS. 18-21, and the first unit pixel SSPX1 may have various suitable structures known to those skilled in the art. For example, the pixel circuit PXC included in the first unit pixel SSPX1 may be configured as a pixel circuit of various suitable structures and/or driving methods known to those skilled in the art. In one or more embodiments, the first unit pixel SSPX1 may be configured in a passive light emitting display panel 21 or the like. In one or more embodiments, the pixel circuit PXC may be omitted, and each of the first and second electrodes of the light source unit LSU may be directly connected to the scan line Si, the data line Dj, the power line, the control line, and/or the like.

Figure 22:
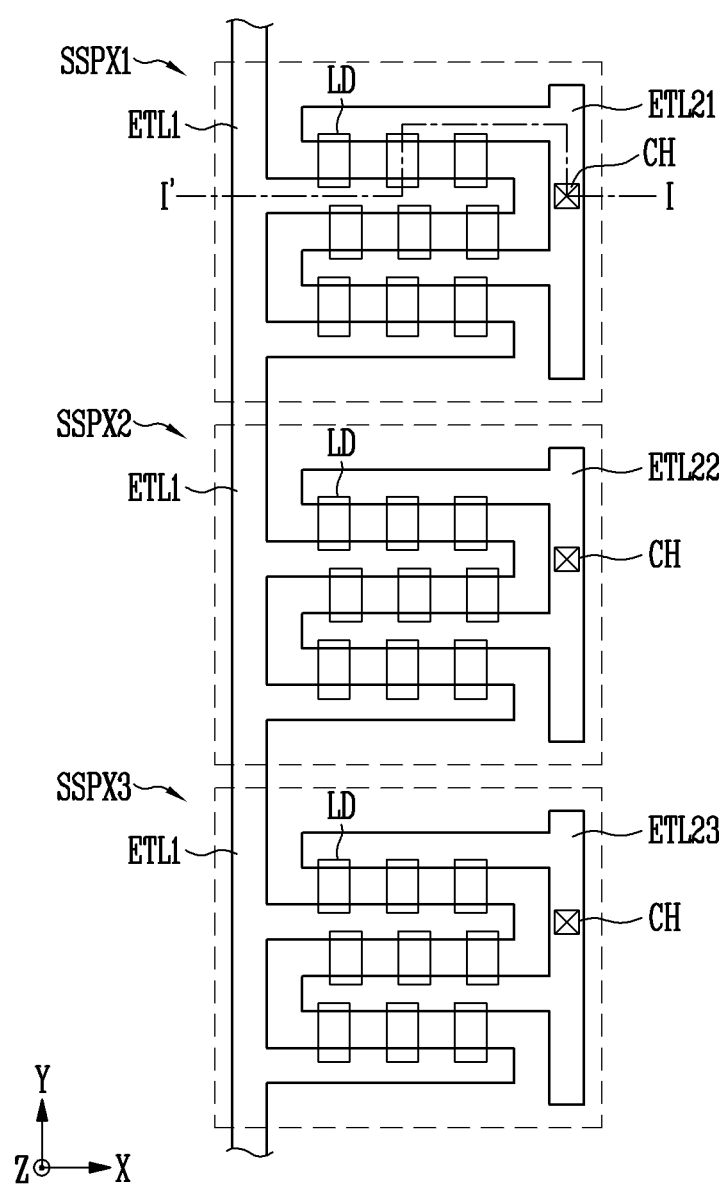
FIG. 22 is a planar layout diagram illustrating a disposition of unit pixels of FIG. 16, according to one or more embodiments of the present disclosure.

FIG. 22 is a planar layout diagram illustrating a disposition of the unit pixels of FIG. 16.

Because the first to third unit pixels SSPX1 to SSPX3 may be substantially the same or similar to each other, the description will be given based on the first unit pixel SSPX1.

Referring to FIG. 22, the first to third unit pixels SSPX1 to SSPX3 may include a first electrode ETL1 and second electrodes ETL21, ETL22, and ETL23 spaced from each other, and at least one light emitting element LD connected between the first electrode ETL1 and the second electrodes ETL21, ETL22, and ETL23.

According to one or more embodiments, the first to third unit pixels SSPX1 to SSPX3 may define emission areas emitting light of different colors. For example, the first unit pixel SSPX1 may include light emitting elements LD that emit red light, the second unit pixel SSPX2 may include light emitting elements LD that emit green light, and the third unit pixel SSPX3 may include light emitting elements LD that emit blue light. As another example, all of the first to third unit pixels SSPX1 to SSPX3 may include light emitting elements LD that emit blue light. In such a case, in order to configure a pixel PXL of a full-color, a light conversion layer and/or a color filter for converting the color of the light emitted from the corresponding unit pixel may be disposed on at least some of the first to third unit pixels SSPX1 to SSPX3.

In one or more embodiments, the first electrode ETL1 may be an electrode shared by the first to third unit pixels SSPX1 to SSPX3. In such a case, the first to third unit pixels SSPX1 to SSPX3 may be disposed along the second direction (Y-axis direction).

In one or more embodiments, the second electrodes ETL21, ETL22, and ETL23 may be spaced from one side of the first electrode ETL1 in the first direction (X-axis direction). The second electrodes ETL21, ETL22, and ETL23 disposed in the first to third unit pixels SSPX1 to SSPX3 may be arranged along the second direction (Y-axis direction).

In one or more embodiments, the first and second electrodes ETL1, ETL21, ETL22, and ETL23 may be spaced from each other (e.g., spaced from each other at predetermined distances or set distances) side by side (e.g., may be arranged parallel to each other).

In one or more embodiments, the first electrode ETL1 may be a cathode electrode electrically connected to the second power VSS. The second electrodes ETL21, ETL22, and ETL23 may be anode electrodes electrically connected to the first power VDD. The light emitting elements LD having one end portion and another end portion electrically connected to the first electrode ETL1 and the second electrodes ETL21, ETL22, andETL23, respectively, are disposed, and thus the first electrode ETL1 and each of the second electrodes ETL21, ETL22, and ETL23 may be electrically connected to each other.

Figure 23:
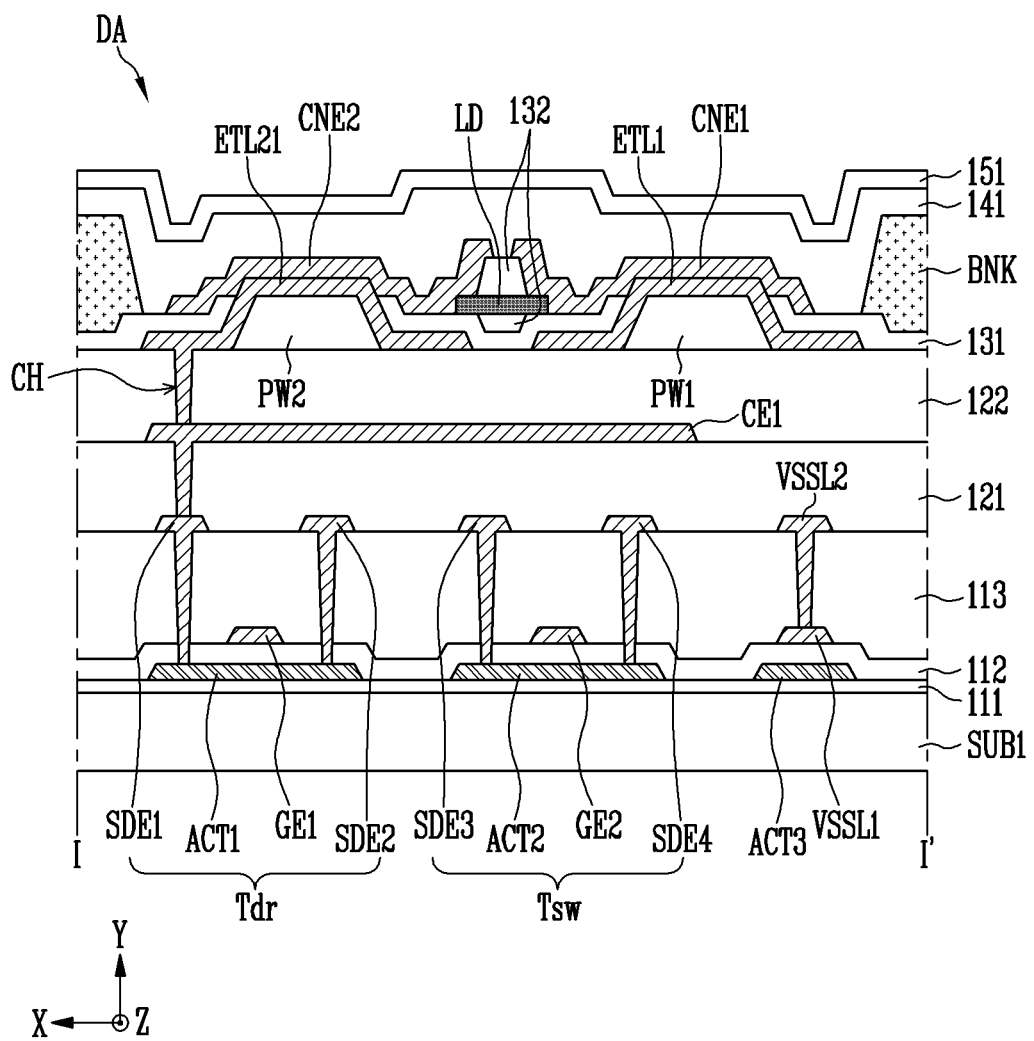
FIG. 23 is a cross-sectional view taken along the line I-I' of FIG. 22, according to one or more embodiments of the present disclosure.

FIG. 23 is a cross-sectional view taken along the line I-I' of FIG. 22, according to one or more embodiments of the present disclosure.

Referring to FIG. 23, the display panel 21 may include a substrate SUB1 disposed in a lower portion thereof. Because the substrate SUB1 has been described with reference to FIG. 16, repetitive description may be omitted, as a person of ordinary skill in the art will be able to understand and appreciate such components from the description provided above.

In one or more embodiments, a first buffer layer 111 is disposed on the substrate SUB1. The first buffer layer 111 functions to flat or substantially flat (e.g., planarize or substantially planarize) a surface of the substrate SUB1 and protect the display panel 21 from penetration of moisture or external air. The first buffer layer 111 may be an inorganic film. The first buffer layer 111 may be a single film or a multilayer film.

In one or more embodiments, a plurality of transistors Tdr and Tsw are disposed on the first buffer layer 111. In one or more embodiments, the plurality of transistors Tdr and Tsw may be thin film transistors (TFTs), and may include a first transistor Tdr that is a driving transistor and a second transistor Tsw that is a switching transistor.

In one or more embodiments, the respective transistors Tdr and Tsw may include semiconductor patterns ACT1 and ACT2, gate electrodes GE1 and GE2, source electrodes SDE2 and SDE4, and drain electrodes SDE1 and SDE3. For example, the first transistor Tdr may include a first semiconductor pattern ACT1, a first gate electrode GE1, a first source electrode SDE2, and a first drain electrode SDE1. The second transistor Tsw may include a second semiconductor pattern ACT2, a second gate electrode GE2, a second source electrode SDE4, and a second drain electrode SDE3. According to one or more embodiments, in the first and second transistors Tdr and Tsw, the source electrode (e.g., SDE2 and SDE4) and the drain electrode (e.g., SDE1 and SDE3) may be interchanged.

For example, the semiconductor layer is disposed on the first buffer layer 111. The semiconductor layer may include the first semiconductor pattern ACT1 and the second semiconductor pattern ACT2 described above. In one or more embodiments, the semiconductor layer may further include a third semiconductor pattern ACT3.

In one or more embodiments, the semiconductor layer may include amorphous silicon, poly silicon, low temperature poly silicon, and an organic semiconductor. In another embodiment, the semiconductor layer may be an oxide semiconductor. In one or more embodiments, the semiconductor layer may include a channel region, and source and drain regions disposed on both sides of the channel region and doped with impurities.

In one or more embodiments, a gate insulating film 112 is disposed on the semiconductor layer (e.g., ACT1, ACT2, ACT3). The gate insulating film 112 may be an inorganic film. The gate insulating film 112 may be a single film or a multilayer film.

In one or more embodiments, a first conductive layer is disposed on the gate insulating film 112. The first conductive layer may include the first gate electrode GE1, the second gate electrode GE2, and a first low power pattern VSSL1. The first conductive layer may be formed of a metal material having conductivity. For example, the first conductive layer may include molybdenum (Mo), aluminum (Al), copper (Cu), and titanium (Ti). The first conductive layer may be a single film or a multilayer film.

In one or more embodiments, the first low power pattern VSSL1 may be electrically connected to the second power line. The first low power pattern VSSL1 may be disposed in the display area DA and may overlap the third semiconductor pattern ACT3.

In one or more embodiments, a second gate insulating film (or an interlayer insulating film) 113 is disposed on the first conductive layer. The second gate insulating film (or the interlayer insulating film) 113 may be an organic film or an inorganic film. The second gate insulating film (or the interlayer insulating film) 113 may be a single film or a multilayer film.

In one or more embodiments, a second conductive layer is disposed on the interlayer insulating film 113. The second conductive layer may include the source electrodes SDE2 and SDE4, the drain electrodes SDE1 and SDE3, and a second low power pattern VSSL2. The second conductive layer is formed of a metal material having conductivity. For example, the source electrodes SDE2 and SDE4 and the drain electrodes SDE1 and SDE3 may include aluminum (Al), copper (Cu), titanium (Ti), and molybdenum (Mo).

In one or more embodiments, the second low power pattern VSSL2 may be electrically connected to the second power line. The second low power pattern VSSL2 may be in contact with the first low power pattern VSSL1 through a contact hole passing through the interlayer insulating film 113. The second low power pattern VSSL2 may be disposed in the display area DA and may overlap the first low power pattern VSSL1 and the third semiconductor pattern ACT3.

In one or more embodiments, the source electrodes SDE2 and SDE4 and the drain electrodes SDE1 and SDE3 may be electrically connected to the source region and the drain region of each of the corresponding semiconductor patterns ACT1 and ACT2 through a contact hole passing through the interlayer insulating film 113 and the gate insulating film 112, respectively.

In one or more embodiments, a first protective layer 121 is disposed on the second conductive layer. In one or more embodiments, the first protective layer 121 is disposed to cover a circuit unit including the transistors Tdr and Tsw. The first protective layer 121 may be a passivation film or a planarization film. The passivation film may include $SiO_2$, $SiN_x$, and the like, and the planarization film may include a material such as acrylic or polyimide. The first protective layer 121 may include both of the passivation film and the planarization film. In one or more embodiments, the passivation film may be disposed on the second conductive layer and the interlayer insulating film 113, and the planarization film may be disposed on the passivation film. An upper surface of the first protective layer 121 may be flat or substantially flat (e.g., may have been planarized or substantially planarized).

In one or more embodiments, a third conductive layer may be disposed on the first protective layer 121. The third conductive layer may include various conductive patterns such as a power line, a signal line, and a connection electrode. The third conductive layer is formed of a metal material having conductivity. For example, the third conductive layer may include aluminum (Al), copper (Cu), titanium (Ti), and molybdenum (Mo).

In one or more embodiments, the third conductive layer may include a first connection pattern CE1. The first connection pattern CE1 may be in contact with the source electrode SDE2 or the drain electrode SDE1 of the first transistor Tdr through a contact hole passing through the first protective layer 121.

In one or more embodiments, a second protective layer 122 is disposed on the third conductive layer. The second protective layer 122 may be a passivation film or a planarization film. The passivation film may include $SiO_2$, $SiN_x$, and the like, and the planarization film may include a material such as acrylic or polyimide. The second protective layer 122 may include both of the passivation film and the planarization film.

In one or more embodiments, first and second partition walls PW1 and PW2 may be disposed on the second protective layer 122.

In one or more embodiments, the first and second partition walls PW1 and PW2 may have various shapes. For example, the first and second partition walls PW1 and PW2 may have a trapezoidal cross-sectional shape that becomes narrower toward an upper portion as shown in the drawing. In such a case, each of the first and second partition walls PW1 and PW2 may have an inclined surface on at least one side surface. However, the present disclosure is not necessarily limited thereto, and the shape of the first and second partition walls PW1 and PW2 may be variously changed.

In one or more embodiments, at least one of the first and second partition walls PW1 and PW2 may be omitted or a position thereof may be changed.

In one or more embodiments, the first and second partition walls PW1 and PW2 may include an insulating material including an inorganic material and/or an organic material. For example, the first and second partition walls PW1 and PW2 may include an inorganic film of at least one layer including various inorganic insulating materials which are currently known, including $SiN_x$, $SiO_x$, or the like. In one or more embodiments, the first and second partition walls PW1 and PW2 may include at least one organic film, a photoresist film, and/or the like of at least one layer including various organic insulating materials which are currently known, or may be configured of an insulator of a single layer or multiple layers including an organic/inorganic material in combination. However, the present disclosure is not necessarily limited thereto, and the configuration material of the first and second partition walls PW1 and PW2 may be variously changed.

In one or more embodiments, the first and second partition walls PW1 and PW2 may function as reflective members. For example, the first and second partition walls PW1 and PW2 may function as reflective members that induce the light emitted from each of the light emitting elements LD to a desired direction (e.g., a suitable direction) to improve light efficiency of the pixel PXL, together with the first and second electrodes ETL1 and ETL21 provided thereon.

In one or more embodiments, the first and second electrodes ETL1 and ETL21 may be disposed on the first and second partition walls PW1 and PW2, respectively. The first electrode ETL1 may be disposed on the first partition wall PW1, and the second electrode ETL21 may be disposed on the second partition wall PW2 to be spaced from each other.

In one or more embodiments, each of the first and second electrodes ETL1 and ETL21 may include at least one conductive material. For example, each of the first and second electrodes ETL1 and ETL21 may include at least one material from among a metal such as Ag, Mg, Al, Pt, Pd, Au, Ni, Nd, Ir, Cr, Ti, or an alloy thereof, a conductive oxide such as ITO, IZO, ZnO, or ITZO, and a conductive polymer such as PEDOT, but is not limited thereto.

In one or more embodiments, each of the first and second electrodes ETL1 and ETL21 may be configured as a single layer or multiple layers. For example, each of the first and second electrodes ETL1 and ETL21 may include at least one reflective electrode layer. In one or more embodiments, each of the first and second electrodes ETL1 and ETL21 may selectively further include at least one of a transparent electrode layer of at least one layer disposed on and/or under a reflective electrode layer, and a conductive capping layer of at least one layer covering an upper portion of the reflective electrode layer and/or the transparent electrode layer.

According to one or more embodiments, each of the reflective electrode layers of the first and second electrodes ETL1 and ETL21 may be configured of an electrode material having a uniform or substantially uniform reflectance. For example, the reflective electrode layer may include at least one of metals such as Ag, Mg, Al, Pt, Pd, Au, Ni, Nd, Ir, Cr, and an alloy thereof, but is not limited thereto. For example, the reflective electrode layer may be configured of various reflective electrode materials. When each of the first and second electrodes ETL1 and ETL21 includes the reflective electrode layer, the light emitted from both ends, for example, the one end portions and the other end portions of each of the light emitting elements LD may be further progressed in a direction in which an image is displayed (for example, a third direction (Z-axis direction) or a front surface direction).

In one or more embodiments, the transparent electrode layers of each of the first and second electrodes ETL1 and ETL21 may be configured of various transparent electrode materials. For example, the transparent electrode layer may include ITO, IZO, or ITZO, but is not limited thereto. In one or more embodiments, each of the first and second electrodes ETL1 and ETL21 may be configured of a triple layer having a stack structure of ITO/Ag/ITO. As described above, when the first and second electrodes ETL1 and ETL21 are configured of multiple layers of at least two or more layers, a voltage drop due to a signal delay may be minimized or reduced. Therefore, a desired voltage (e.g., a suitable voltage) may be effectively transferred to the light emitting elements LD.

In one or more embodiments, when each of the first and second electrodes ETL1 and ETL21 includes a conductive capping layer covering the reflective electrode layer and/or the transparent electrode layer, the reflective electrode layer and the like of the first and second electrodes ETL1 and ETL21 may be prevented or protected from being damaged due to a defect generated during a manufacturing process of the pixel PXL, or the like. However, the conductive capping layer may be selectively included in the first and second electrodes ETL1 and ETL21, and may be omitted according to one or more embodiments. In one or more embodiments, the conductive capping layer may be regarded as a component of each of the first and second electrodes ETL1 and ETL21, or may be regarded as a separate component disposed on the first and second electrodes ETL1 and ETL21.

In one or more embodiments, the second electrode ETL21 may be disposed to at least partially overlap the first connection pattern CE1. The second electrode ETL21 may be in contact with the first connection pattern CE1 through a first contact hole CH passing through the second protective layer 122.

In one or more embodiments, a first insulating layer 131 may be disposed in one region of the first and second electrodes ETL1 and ETL21. For example, the first insulating layer 131 may be formed to cover the one region of the first and second electrodes ETL1 and ETL21, and may include an opening portion that exposes the other region of the first and second electrodes ETL1 and ETL21.

For example, firstly, the first insulating layer 131 may be formed to entirely cover the first and second electrodes ETL1 and ETL21. After the light emitting elements LD are supplied and aligned on the first insulating layer 131, the first insulating layer 131 may be partially opened to expose the first and second electrodes ETL1 and ETL21. In one or more embodiments, after the supply and the alignment of the light emitting elements LD are completed, the first insulating layer 131 may be patterned in a form of an individual pattern that is locally disposed under the light emitting elements LD.

Therefore, the first insulating layer 131 may be interposed between the first and second electrodes ETL1 and ETL21 and the light emitting elements LD, and may expose at least one region of each of the first and second electrodes ETL1 and ETL21. The first insulating layer 131 may be formed to cover the first and second electrodes ETL1 and ETL21 after the first and second electrodes ETL1 and ETL21 are formed, to protect the first and second electrodes ETL1 and ETL21 from damage (or to prevent damages thereto) or extraction of metal in a subsequent process. In one or more embodiments, the first insulating layer 131 may stably support each of the light emitting elements LD. According to one or more embodiments, the first insulating layer 131 may be omitted.

In one or more embodiments, a bank BNK may be disposed on the first insulating layer 131. For example, the bank BNK may be formed at a boundary of the sub pixels to surround the sub pixels SPX1, SPX2, and SPX3 of FIG. 17, and may function as a pixel defining film that partitions the emission area.

In one or more embodiments, a second insulating layer 132 may be disposed on the light emitting element LD. The second insulating layer 132 may be partially disposed on the light emitting element LD to expose the one end portion and the other end portion of the light emitting elements LD.

In one or more embodiments, the second insulating layer 132 may be formed in an independent pattern in each emission area, but is not limited thereto. In one or more embodiments, as shown in FIG. 23, when a space is present between the first insulating layer 131 and the light emitting elements LD before formation of the second insulating layer 132, the second insulating layer 132 may be disposed in the space. Therefore, the light emitting elements LD may be supported more stably.

In one or more embodiments, first and second contact electrodes CNE1 and CNE2 may be disposed on the light emitting element LD and the first and second electrodes ETL1 and ETL21.

In one or more embodiments, the first and second contact electrodes CNE1 and CNE2 may electrically connect the one end portion and the other end portion of the light emitting elements LD to the first and second electrodes ETL1 and, respectively.

For example, the first contact electrode CNE1 may be disposed on the first electrode ETL1 to be in contact with the first electrode ETL1. The first contact electrode CNE1 may be disposed to be in contact with the first electrode ETL1 on one region of the first electrode ETL1 which is not covered by the first insulating layer 131. The first contact electrode CNE1 may be disposed on the one end portion of the light emitting element LD to be in contact with at least one light emitting element adjacent to the first electrode ETL1, for example, one end portion of the plurality of light emitting elements LD. For example, the first contact electrode CNE1 may be disposed to cover the one end portion of the light emitting elements LD and at least one region of the first electrode ETL1 corresponding thereto. Therefore, the one end portion of the light emitting elements LD may be electrically connected to the first electrode ETL1.

Similarly, the second contact electrode CNE2 may be disposed on the second electrodes ETL21, ETL22, and ETL23 to be in contact with the second electrodes ETL21, ETL22, and ETL23. For example, the second contact electrode CNE2 may be disposed to be in contact with the second electrode ETL21 on one region of the second electrode ETL21 which is not covered by the first insulating layer 131. The second contact electrode CNE2 may be disposed on the end portions of the light emitting elements LD to be in contact with the end portions of at least two light emitting elements LD adjacent to the second electrode ETL21. For example, the second contact electrode CNE2 may be disposed to cover the one end portion or the other end portion of the light emitting elements LD and at least one region of the second electrode ETL21 corresponding thereto. Therefore, the one end portion or the other end portion of the light emitting elements LD may be electrically connected to each second electrode ETL21.

For example, the one end portion of the light emitting element LD may be in contact with the first contact electrode CNE1, and the other end portion of the light emitting element LD may be in contact with the second contact electrode CNE2.

In one or more embodiments, a third insulating layer 141 may be disposed on the first and second contact electrodes CNE1 and CNE2.

In one or more embodiments, the third insulating layer 141 may cover the first and second partition walls PW1 and PW2, the first and second electrodes ETL1 and ETL21, the light emitting elements LD, the first and second contact electrodes CNE1 and CNE2, and the bank BNK.

According to one or more embodiments, each of the first to third insulating layers 131, 132, and 141 may be configured of a single layer or multiple layers, and may include at least one inorganic insulating material and/or an organic insulating material. In one or more embodiments, the first to third insulating layers 131, 132, and 141 may include different insulating materials, or at least some of the first to third insulating layers 131, 132, and 141 may include the same insulating material.

In one or more embodiments, a thin film encapsulation layer 151 including an inorganic film and/or an organic film of at least one layer may be disposed on the third insulating layer 141. The thin film encapsulation layer 151 may be another insulating layer. According to one or more embodiments, the thin film encapsulation layer 151 may be omitted.

Although the example embodiments have been described above with reference to the accompanying drawings, those skilled in the art will understand that the disclosure may be carried out in other specific forms without changing the technical spirit or essential characteristics thereof. Therefore, it should be understood that the above-described embodiments are illustrative and not restrictive in all aspects.

What is claimed is:

1. A light emitting element comprising:
a first semiconductor layer, a second semiconductor layer, and an active layer between the first semiconductor layer and the second semiconductor layer;
a protective layer surrounding an outer surface of at least one of the first semiconductor layer, the second semiconductor layer, and the active layer; and
an insulating layer surrounding an outer surface of the protective layer,
wherein a surface of at least one of the first semiconductor layer, the second semiconductor layer, and the active layer comprises a first lattice point,
wherein the protective layer comprises a first atom and a second atom, and
wherein the first atom of the protective layer is at the first lattice point.

2. The light emitting element of claim 1, wherein the first atom comprises a Group 3 element, and the second atom comprises a Group 5 element.

3. The light emitting element of claim 1, wherein at least one of the first semiconductor layer, the second semiconductor layer, and the active layer comprises a third atom and a fourth atom, and
wherein the third atom comprises a Group 3 element, and the fourth atom comprises a Group 5 element.

4. The light emitting element of claim 3, wherein the third atom comprises a same element as the first atom.

5. The light emitting element of claim 3, wherein the fourth atom comprises a same element as the second atom.

6. The light emitting element of claim 3, wherein the first atom is bonded to the fourth atom at the first lattice point.

7. The light emitting element of claim 1, wherein a thickness of the protective layer is smaller than a thickness of the insulating layer.

8. The light emitting element of claim 1, wherein the protective layer is a monolayer comprising the first atom and the second atom.

9. The light emitting element of claim 1, wherein the insulating layer comprises an inorganic material.

10. The light emitting element of claim 1, wherein the insulating layer is directly on the protective layer.

11. The light emitting element of claim 1, wherein the first atom comprises a Group 5 element, and the second atom comprises a Group 3 element.

12. The light emitting element of claim 1, wherein the surface of at least one of the first semiconductor layer, the second semiconductor layer, and the active layer further comprises a second lattice point, and
wherein the second atom of the protective layer is at the second lattice point.

13. A display device comprising:
a plurality of pixels on a substrate,
wherein each of the pixels comprises:
a first electrode and a second electrode spaced from each other on the substrate; and
a plurality of light emitting elements having one end portion connected to the first electrode and another end portion connected to the second electrode,
wherein each of the light emitting elements comprises a semiconductor core;
a protective layer surrounding an outer surface of the semiconductor core and comprising a first atom and a second atom; and
an insulating layer surrounding an outer surface of the protective layer,
wherein a surface of the semiconductor core comprises a first lattice point, and
wherein the first atom of the protective layer is at the first lattice point.

14. The display device of claim 13, wherein the first atom comprises a Group 3 element, and the second atom comprises a Group 5 element.

15. The display device of claim 13, wherein the semiconductor core comprises a first semiconductor layer, a second semiconductor layer, and an active layer between the first semiconductor layer and the second semiconductor layer.

16. The display device of claim 13, wherein the semiconductor core comprises a third atom and a fourth atom, the third atom comprising a Group 3 element, and the fourth atom comprising a Group 5 element.

17. The display device of claim 16, wherein the first atom is bonded to the fourth atom at the first lattice point.

18. The display device of claim 16, wherein the third atom comprises a same element as the first atom.

19. The display device of claim 16, wherein the fourth atom comprises a same element as the second atom.

20. The display device of claim 13, wherein a thickness of the protective layer is smaller than a thickness of the insulating layer.

21. The display device of claim 13, wherein the insulating layer comprises an inorganic material.

22. The display device of claim 13, wherein one surface of the protective layer is in contact with the semiconductor core, and another surface of the protective layer is in contact with the insulating layer.

* * * * *